US012613197B2

(12) United States Patent
Chuang et al.

(10) Patent No.: US 12,613,197 B2
(45) Date of Patent: Apr. 28, 2026

(54) LOW-REFLECTIVITY BACK-ILLUMINATED IMAGE SENSOR

(71) Applicant: KLA Corporation, Milpitas, CA (US)

(72) Inventors: Yung-Ho Alex Chuang, Cupertino, CA (US); Yinying Xiao-Li, San Jose, CA (US); Sisir Yalamanchili, Milpitas, CA (US); John Fielden, Los Altos, CA (US); David L. Brown, Los Gatos, CA (US)

(73) Assignee: KLA Corporation, Milpitas, CA (US)

( * ) Notice: Subject to any disclaimer, the term of this patent is extended or adjusted under 35 U.S.C. 154(b) by 478 days.

(21) Appl. No.: 17/107,539

(22) Filed: Nov. 30, 2020

(65) Prior Publication Data

US 2021/0164917 A1     Jun. 3, 2021

Related U.S. Application Data

(60) Provisional application No. 62/943,173, filed on Dec. 3, 2019.

(51) Int. Cl.
*G01N 21/95* (2006.01)
*H01L 27/146* (2006.01)
(Continued)

(52) U.S. Cl.
CPC ....... *G01N 21/9501* (2013.01); *H10F 39/024* (2025.01); *H10F 39/026* (2025.01); *H10F 39/199* (2025.01); *H10F 39/805* (2025.01)

(58) Field of Classification Search
CPC ......... H01L 27/14685; H01L 27/14625; H01L 27/1462; H01L 27/1464; H01L 27/14687;
(Continued)

(56) References Cited

U.S. PATENT DOCUMENTS 3,356,543 A * 12/1967 Desmond .............. H01L 21/221
257/156
5,608,526 A     3/1997 Piwonka-Corle et al.
(Continued)

FOREIGN PATENT DOCUMENTS

CN     107667410 A     2/2018
CN     110224033 A     9/2019
(Continued)

OTHER PUBLICATIONS

U.S. Appl. No. 16/216,779, filed Dec. 10, 2018, Keith et al.
(Continued)

*Primary Examiner* — Sang H Nguyen
(74) *Attorney, Agent, or Firm* — Suiter Swantz IP

(57) ABSTRACT

An image sensor for short-wavelength light includes a semiconductor membrane, circuit elements formed on a first surface of the semiconductor membrane, and a boron-coated, textured surface on a second surface of the semiconductor membrane. The textured surface comprises pseudo-random, periodic, and/or random distribution of upright pyramids, inverted pyramids, and/or nanocones. The textured surface reduces the reflection of incident light across wide bands in the DUV and VUV regimes, thus increasing the amount of light absorbed and improving the efficiency of the image sensor. Reflectance may be further reduced by applying an antireflective coating on the textured surface. The image sensor may be a two-dimensional area sensor, or a one-dimensional array sensor. and incorporated in an inspection system.

17 Claims, 15 Drawing Sheets

(51) Int. Cl.
  *H10F 39/00* (2025.01)
  *H10F 39/12* (2025.01)

(58) Field of Classification Search
  CPC ........ H01L 27/14632; H01L 27/14629; G01N
  21/9501
  See application file for complete search history.

(56) References Cited

U.S. PATENT DOCUMENTS

| | | | |
|---|---|---|---|
| 5,999,310 | A | 12/1999 | Shafer et al. |
| 6,297,880 | B1 | 10/2001 | Rosencwaig et al. |
| 6,451,218 | B1 | 9/2002 | Holdermann |
| 6,555,440 | B1* | 4/2003 | Geefay ................. H01L 29/868 |
| | | | 438/983 |
| 7,474,461 | B2 | 1/2009 | Chuang et al. |
| 7,525,649 | B1 | 4/2009 | Leong et al. |
| 7,705,331 | B1 | 4/2010 | Kirk et al. |
| 7,745,901 | B1 | 6/2010 | McCaffrey et al. |
| 7,817,260 | B2 | 10/2010 | Chuang et al. |
| 7,847,253 | B2 | 12/2010 | Carey et al. |
| 7,957,066 | B2 | 6/2011 | Armstrong et al. |
| 7,968,834 | B2 | 6/2011 | Veeder |
| 8,207,051 | B2 | 6/2012 | Sickler et al. |
| 8,212,327 | B2 | 7/2012 | Kurfiss et al. |
| 8,309,389 | B1 | 11/2012 | Alie et al. |
| 8,476,681 | B2 | 7/2013 | Haddad et al. |
| 9,080,971 | B2 | 7/2015 | Kandel et al. |
| 9,228,943 | B2 | 1/2016 | Wang et al. |
| 9,279,774 | B2 | 3/2016 | Romanovsky et al. |
| 9,306,094 | B2 | 4/2016 | Levy et al. |
| 9,470,639 | B1 | 10/2016 | Zhuang et al. |
| 9,723,703 | B2 | 8/2017 | Bezel et al. |
| 9,865,447 | B2 | 1/2018 | Chuang et al. |
| 9,891,177 | B2 | 2/2018 | Vazhaeparambil et al. |
| 10,930,700 | B2 | 2/2021 | Kasuya et al. |
| 11,156,832 | B1 | 10/2021 | Keith et al. |
| 2009/0152663 | A1* | 6/2009 | Tu ......................... H10F 71/121 |
| | | | 257/E31.11 |
| 2010/0300518 | A1* | 12/2010 | Moslehi .................. H10F 77/14 |
| | | | 257/E31.038 |
| 2013/0171767 | A1* | 7/2013 | Moslehi .............. H01L 31/0682 |
| | | | 438/89 |
| 2013/0258483 | A1* | 10/2013 | Pett ........................ G02B 5/045 |
| | | | 359/601 |
| 2013/0264481 | A1 | 10/2013 | Chern et al. |
| 2013/0288418 | A1* | 10/2013 | Wang ...................... H10F 10/14 |
| | | | 438/68 |
| 2013/0298977 | A1* | 11/2013 | Chen ................. H01L 21/02612 |
| | | | 257/618 |
| 2014/0077220 | A1* | 3/2014 | Kryliouk .................. H01L 33/12 |
| | | | 438/29 |
| 2015/0200216 | A1* | 7/2015 | Muramatsu ......... H01L 27/1464 |
| | | | 438/72 |
| 2016/0093763 | A1* | 3/2016 | Rana ............... H01L 31/022441 |
| | | | 438/57 |
| 2016/0307946 | A1* | 10/2016 | Huang .............. H01L 27/14685 |
| 2016/0343532 | A1* | 11/2016 | Chuang ................. H01L 31/107 |
| 2017/0047207 | A1* | 2/2017 | Chuang .............. G03F 7/70008 |
| 2018/0108514 | A1 | 4/2018 | Chuang et al. |
| 2018/0209780 | A1* | 7/2018 | Schattenburg ....... G01B 11/002 |
| 2019/0131465 | A1* | 5/2019 | Chern .............. H01L 27/14806 |
| 2019/0165134 | A1* | 5/2019 | Diaz ................. H01L 29/66575 |
| 2019/0214217 | A1* | 7/2019 | Sommer ................... H01J 5/18 |
| 2019/0228962 | A1* | 7/2019 | Mizusawa ........... H01L 21/0217 |
| 2019/0296070 | A1* | 9/2019 | Jin .................... H01L 27/14625 |
| 2020/0194476 | A1 | 6/2020 | Chuang et al. |

FOREIGN PATENT DOCUMENTS

| | | |
|---|---|---|
| JP | 2012530257 A | 11/2012 |
| JP | 2013033864 A | 2/2013 |
| JP | 2015520939 A | 7/2015 |
| JP | 2015532014 A | 11/2015 |
| JP | 2015536012 A | 12/2015 |
| JP | 2017509142 A | 3/2017 |
| JP | 2017069374 A | 4/2017 |
| JP | 2018107314 A | 7/2018 |
| JP | 2018521457 A | 8/2018 |
| JP | 2018529188 A | 10/2018 |
| JP | 2019046960 A | 3/2019 |
| KR | 1020180062982 A | 6/2018 |
| WO | 2011147122 A1 | 12/2011 |
| WO | 2017126329 A1 | 7/2017 |
| WO | 2017150616 A1 | 9/2017 |

OTHER PUBLICATIONS

PCT International Search Report and Written Opinion for International Application No. PCT/US2020/062761 dated Apr. 5, 2021, 11 pages.

A.A. Hamzah, N. Abd Aziz, B. Yeop Majlis, J. Yunas, C.F. Dee, and B. Bais, "Optimization of HNA etching parameters to produce high aspect ratio solid silicon microneedles", J. Micromech. Microeng. 22, 095017 (2012).

B.S. Akila, K. Vaithinathan, T. Balaganapathi, S. Vinoth, and P. Thilakan, "Investigations on the correlation between surface texturing histogram and the spectral reflectance of (100) Crystalline Silicone Substrate textured using anisotropic etching", Sensors and Actuators A: Physical 263, 445 (2017).

Dasog M., Profiling photoinduced carrier generation in semiconductor microwire arrays via photoelectrochemical metal deposition. Nano Lett. 2016, 16, 8, 5015-5021.

J Dalvi-Malhotra, et. al., A spin-on photosensitive polymeric etch protection mask for anisotropic wet etching of silicon. J. Micromech. Microeng. 18 (2008) 025029 (8pp).

Miguel A. Gonsalves et. al., Chapter 22—Wet Etching of Silicon, Handbook of Silicon Based MEMS Materials and Technologies (Second Edition), Micro and Nano Technologies, 2015, pp. 470-502.

Puqun Wang, et. al., Periodic upright nanopyramids for light management applications in ultrathin crystalline silicon solar cells. IEEE Journal of Photovoltaics, vol. 7, No. 2, Mar. 2017.

S.E. Holland, D.E. Groom, N.P. Palaio, R.J. Stove, and M. Wei, "Fully-depleted, back-illuminated charge-coupled devices fabricated on high-resistivity silicon", IEEE Trans. Electron Devices 50, 225 (2003).

Sarubbi et al., J. Electron. Material, vol. 39, pp. 162-173, 2010.

Yalamanchili S., et. al., Enhanced absorption and <1% spectrum-and-angle-averaged reflection in tapered microwire arrays. ACS Photonics 2016, 3, 10, 1854-1861.

Zhang et al., Highly-ordered silicon inverted nanocone arrays with broadband light antireflectance. Nanoscale Research Letters (2015) 10:9.

Taiwan Patent Office, Office Action received in TW Patent Application No. 109142644, Feb. 2, 2024, 9 pages (official translation).

Israel Patent Office, Office Action received in IL Patent Application No. 293248, Feb. 21, 2024, 6 pages.

Taiwan Patent Office, Office Action received in TW Patent Application No. 109142644, Feb. 2, 2024, 26 pages (including translation).

Korean Patent Office, Office Action received in KR Application No. 10-2022-7022645, Dec. 2, 2024, 16 pages (including translation).

Japanese Patent Office, Office Action received in JP Application No. 2022-533095, Jul. 26, 2024, 11 pages (including translation).

Chinese Patent Office, Office Action received in CN Application No. 202080083592.1, Dec. 8, 2025, 20 pages (including translation).

* cited by examiner

200

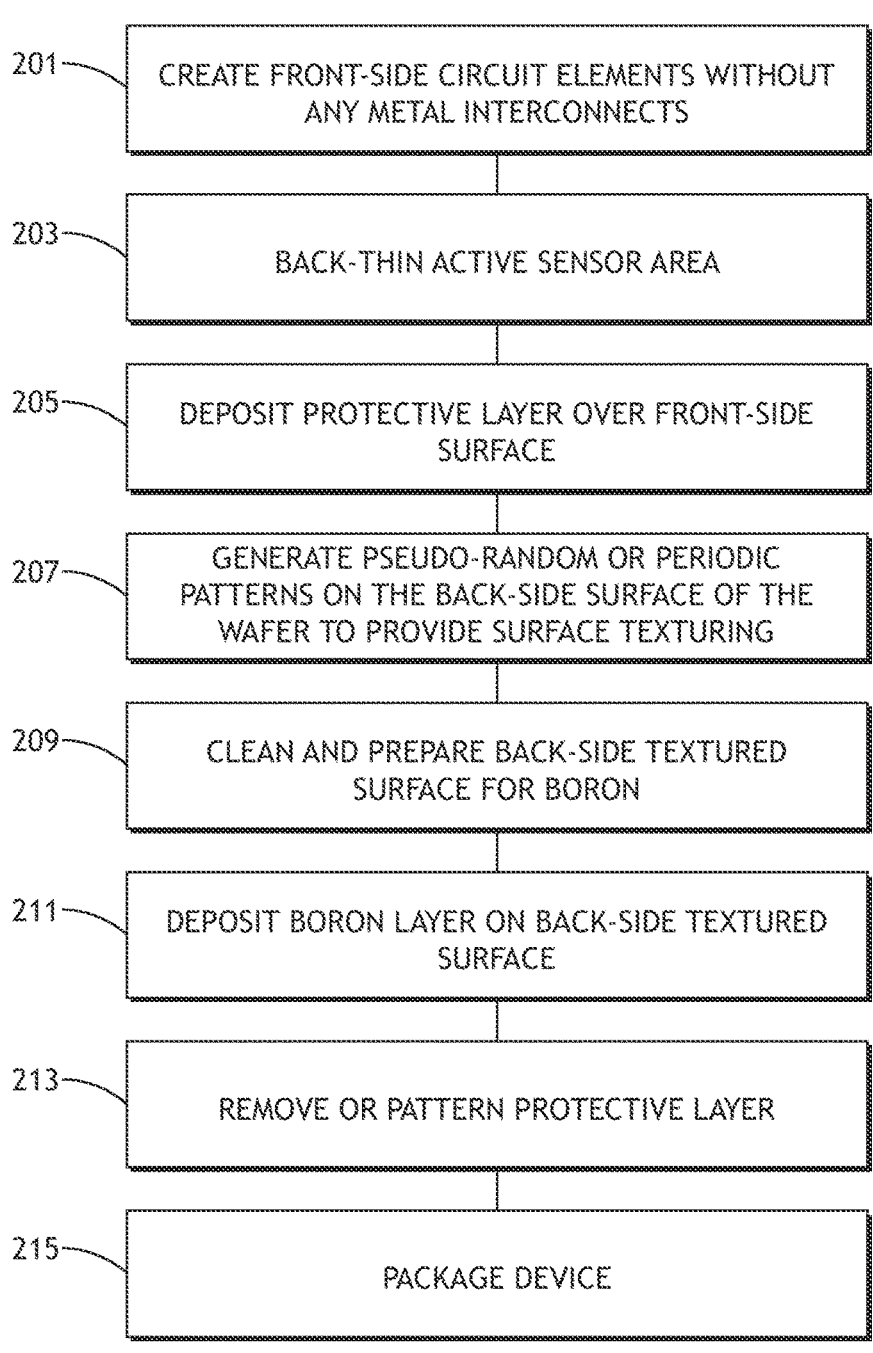

201 — CREATE FRONT-SIDE CIRCUIT ELEMENTS WITHOUT ANY METAL INTERCONNECTS

203 — BACK-THIN ACTIVE SENSOR AREA

205 — DEPOSIT PROTECTIVE LAYER OVER FRONT-SIDE SURFACE

207 — GENERATE PSEUDO-RANDOM OR PERIODIC PATTERNS ON THE BACK-SIDE SURFACE OF THE WAFER TO PROVIDE SURFACE TEXTURING

209 — CLEAN AND PREPARE BACK-SIDE TEXTURED SURFACE FOR BORON

211 — DEPOSIT BORON LAYER ON BACK-SIDE TEXTURED SURFACE

213 — REMOVE OR PATTERN PROTECTIVE LAYER

215 — PACKAGE DEVICE

FIG.2

Example of Etching of Periodic Nanocones

352

Mask

Nanocone Surface

Etched Si

Si Starting Surface

300

Example of Etching of Pseudo-Random Nanocones

300

Si Starting Surface

Etched Si

Mask

Nanocone
Surface

LOW-REFLECTIVITY BACK-ILLUMINATED IMAGE SENSOR

CROSS-REFERENCE TO RELATED APPLICATIONS

The present application claims priority to U.S. Provisional Patent Application No. 62/943,173, filed Dec. 3, 2019, naming Yung-Ho Alex Chuang, Yinying Xiaoli, Sisir Yalamanchili, John Fielden, and David Brown as inventors, which is incorporated herein by reference in the entirety.

TECHNICAL FIELD

The present disclosure relates generally to image sensors suitable for sensing radiation in deep ultraviolet (DUV) and vacuum ultraviolet (VUV) wavelengths and methods for making such image sensors. These sensors are suitable for use in photomask, reticle, or wafer inspection systems and other applications.

BACKGROUND

The integrated circuit industry requires inspection tools with increasingly higher resolution to resolve ever smaller features of integrated circuits, photomasks, reticles, solar cells, and charge-coupled devices as well as the ability to detect defects whose sizes are of the order of, or smaller than, those feature sizes.

Inspection systems operating at short wavelengths, such as wavelengths shorter than about 250 nm, can provide such resolution in many cases. Specifically, for photomask or reticle inspection, it is desirable to inspect samples using a wavelength identical, or close, to the wavelength that will be used for lithography (e.g., approximately 193.4 nm for current generation lithography and approximately 13.5 nm for future EUV lithography), as the phase-shifts of the inspection light caused by the patterns will be identical or very similar to those caused during lithography. For inspecting semiconductor patterned wafers, inspection systems operating over a relatively broad range of wavelengths, such as a wavelength range that includes wavelengths in the near UV, DUV, and/or VUV ranges, can be advantageous because a broad range of wavelengths can reduce the sensitivity to small changes in layer thicknesses or pattern dimensions that can cause large changes in reflectivity at an individual wavelength.

In order to detect small defects or particles on photomasks, reticles, and semiconductor wafers, high signal-to-noise ratios are required. High photon or particle flux densities are required to ensure high signal-to-noise ratios when inspecting at high speed because statistical fluctuations in the numbers of photons detected (Poisson noise) is a fundamental limit on the signal-to-noise ratio. In many cases, approximately 100,000 or more photons per pixel are needed. Because inspection systems are typically in use 24 hours per day with only short stoppages, the detectors are exposed to large doses of radiation after only a few months of operation.

A photon with a vacuum wavelength of 250 nm has energy of approximately 5 eV. The bandgap of silicon dioxide is about 10 eV. Although it would appear that such wavelength photons cannot be absorbed by silicon dioxide, silicon dioxide as grown on a silicon surface must have some dangling bonds at the interface with the silicon because the silicon dioxide structure cannot perfectly match that of the silicon crystal. Furthermore, because the silicon dioxide is amorphous, there are likely also some dangling bonds within the material. In practice, there will be a non-negligible density of defects and impurities within the oxide, as well as at the interface to underlying semiconductor, that can absorb photons with deep UV wavelengths, particularly those shorter than about 250 nm in wavelength. Furthermore, under high radiation flux density, two high-energy photons may arrive near the same location within a very short time interval (nanoseconds or picoseconds), which can lead to electrons being excited to the conduction band of the silicon dioxide by two absorption events in rapid succession or by two-photon absorption.

A further requirement for sensors used for inspection, metrology and related applications is high sensitivity. As explained above, high signal-to-noise ratios are required. If the sensor does not convert a large fraction of the incident photons into signal, then a higher intensity light source would be required in order to maintain the same inspection or measurement speed compared with an inspection or metrology system with a more efficient sensor. A higher intensity light source would expose the instruments optics and the sample being inspected or measured to higher light intensities, possibly causing damage or degradation over time. A higher intensity light source would also be more expensive or, particularly at DUV and VUV wavelengths, may not be available. Silicon reflects a high percentage of DUV and VUV light incident on it. For example, near 193 nm in wavelength, silicon with a 2 nm oxide layer on its surface (such as a native oxide layer) reflects approximately 65% of the light incident on it. Growing an oxide layer of about 21 nm on the silicon surface reduces the reflectivity to close to 40% for wavelengths near 193 nm. A detector with 40% reflectivity is significantly more efficient than one with 65% reflectivity, but lower reflectivity, and hence higher efficiency, is desirable.

DUV and VUV wavelengths are strongly absorbed by silicon. Such wavelengths may be mostly absorbed within about 10 nm or a few tens of nm of the surface of the silicon. The efficiency of a sensor operating at DUV or VUV wavelengths depends on how large a fraction of the electrons created by the absorbed photons can be collected before the electrons recombine. Silicon dioxide can form a high-quality interface with silicon with a low density of defects. Most other materials including many of those commonly used for anti-reflection coatings, if deposited directly on silicon, result in a very high density of electrical defects at the surface of silicon. A high density of electrical defects on the surface of silicon may not be an issue for a sensor intended to operate at visible wavelengths, as such wavelengths may typically travel about 100 nm or more into the silicon before being absorbed and may, therefore, be little affected by electrical defects on the silicon surface. However, DUV and VUV wavelengths are absorbed so close to the silicon surface that electrical defects on the surface and/or trapped charged within the layer(s) on the surface can result in a significant fraction of the electrons created recombining at, or near, the silicon surface and being lost, resulting in a low efficiency sensor. Hence, it is important to control the state of the silicon surface to minimize losses of photo-electrons.

What is therefore needed is an image sensor capable of efficiently detecting high-energy photons that overcomes some, or all, of the above disadvantages.

SUMMARY

A low-reflectivity back-illuminated image sensor is disclosed, in accordance with one or more embodiments of the present disclosure. In one illustrative embodiment, the image sensor includes a semiconductor membrane comprising an epitaxial layer, wherein the epitaxial layer includes a first surface and a second textured surface opposite of the first surface. In another illustrative embodiment, the image sensor includes one or more circuit elements formed on the first surface of the epitaxial layer. In another illustrative embodiment, the image sensor includes a boron layer disposed on the second textured surface of the epitaxial layer. In another illustrative embodiment, the second textured surface comprises a pseudo-random distribution of at least one of upright pyramids, inverted pyramids, or nanocones. In another illustrative embodiment, the second textured surface comprises a periodic distribution of at least one of upright pyramids, inverted pyramids, or nanocones. In another illustrative embodiment, the second textured surface comprises a random distribution of at least one of upright pyramids, inverted pyramids, or nanocones. In another illustrative embodiment, the image sensor is incorporated with an inspection system.

A method of fabricating a low-reflectivity back-illuminated image sensor is disclosed, in accordance with one or more embodiments of the present disclosure. In one illustrative embodiment, the method includes forming an epitaxial layer on a substrate. In another illustrative embodiment, the method includes forming a gate layer on the substrate. In another illustrative embodiment, the method includes forming one or more circuit element layer on the gate layer. In another illustrative embodiment, the method includes thinning the substrate to generate a thinned substrate, the thinned substrate exposing at least portions of the epitaxial layer. In another illustrative embodiment, the method includes pre-etching the exposed portions of the epitaxial layer. In another illustrative embodiment, the method includes generating a surface texture on the exposed portions of the epitaxial layer. In another illustrative embodiment, the method includes forming a boron layer on the surface texture.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

FIG. 2 illustrates a flow diagram depicting a method of fabricating an image sensor according to an exemplary embodiment of the present disclosure.

FIGS. 3A-3I illustrate various pseudo-random and periodic pattern approaches for implementation within the image sensor, in accordance with one or more embodiments of the present disclosure.

DETAILED DESCRIPTION

Figure 1:
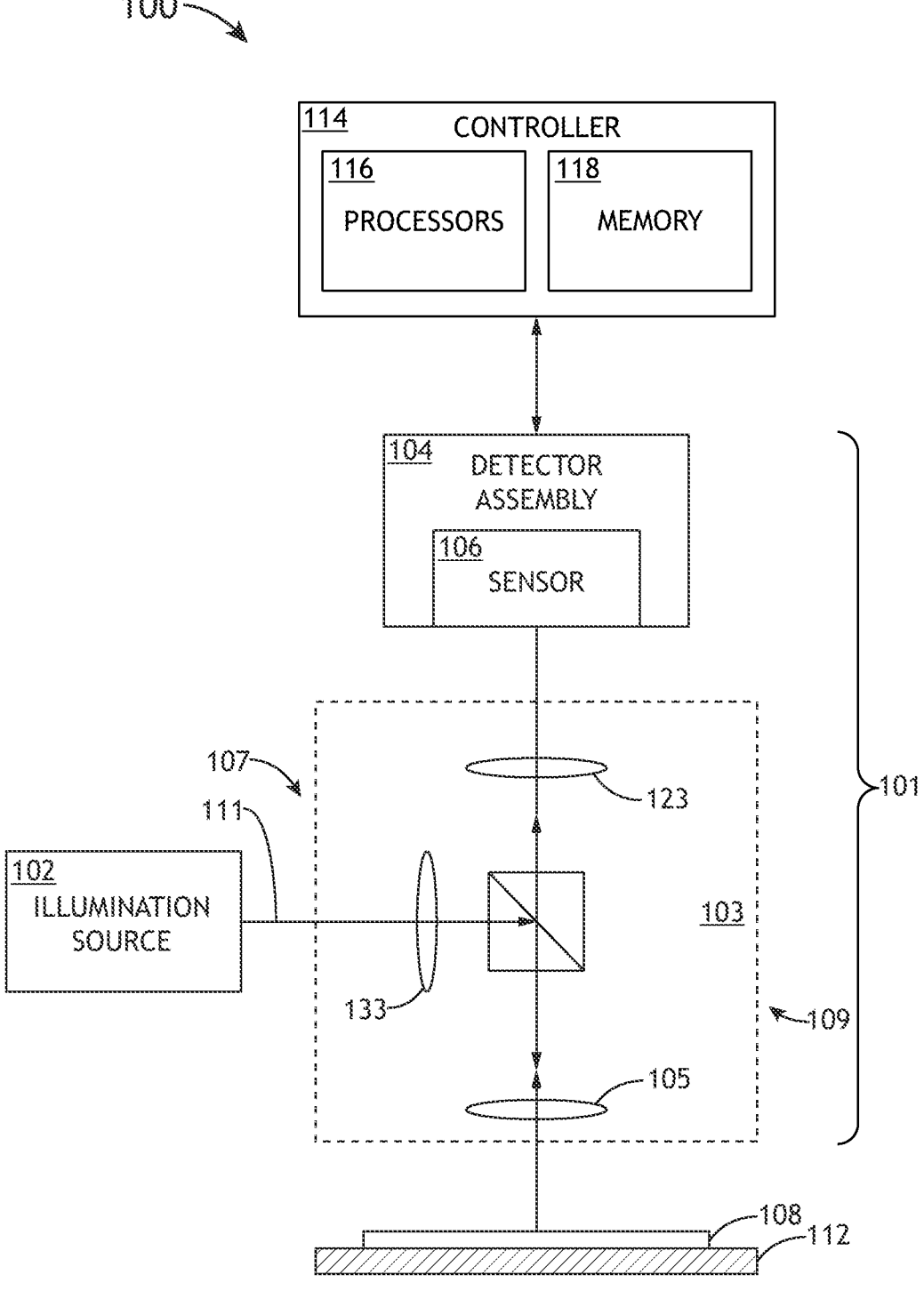
FIG. 1 illustrates a block diagram view of a characterization system, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings Embodiments of the present disclosure are directed to image sensors for semiconductor inspection and metrology. In particular, image sensors with high-quantum-efficiency and long-life operation for DUV and/or VUV radiation are disclosed. These image sensors are thinned from the backside, so that they are highly sensitive to radiation impinging on the back-side of the image sensors (when these image sensors are back-illuminated). The back-side silicon surface may be textured by wet chemical etching or other structuring methods, such as reactive ion etching (RIE), inductively coupled plasma reactive ion etching (ICP-RIE), ultra-fast laser etching, electrochemical etching, electron beam lithography or photolithography-defined etching, and mechanical grooving, so that upright or inverted pyramidal, nanocones (or other tapered structures) are formed on the surface. The textured surface may reduce the reflection of incident light across wide bands in the DUV and VUV, thus increasing the absorbed light intensity.

Wet chemical etching may be relatively inexpensive compared with other structuring methods, and may be a more mature process as it is widely used in CMOS fabrication. Known techniques for the wet chemical pyramidal structural etching of (100)-oriented silicon surfaces use alkaline media, such as alkali hydroxides, alkali carbonates, ammonia or choline. Various etchants such as ethylenediaminepyrocatechol (EDP), hydrazine, sodium hydroxide (NaOH), sodium carbonate ($Na_2CO_3$), trisodium phosphate ($Na_3PO_4$), sodium silicate ($Na_2SiO_3$), potassium hydroxide (KOH), and tetramethylammonium hydroxide (TMAH) are known in the art. The most common recipes comprise water, NaOH or KOH and alcohol. The alcohol component may be either ethylene glycol or isopropanol. The known methods for wet chemical structural etching of silicon merely relate to the generation of a pyramidal texture.

Surface texturing of silicon substrate removes the portion of material selectively creating either upright or inverted pyramidal structures depending on the specific texturization procedure. As a result, the material density may be reduced at the surface resulting in a reduced complex dielectric contrast, which gives rise to a wavelength-dependent reduction of surface reflection.

Deposited on the textured silicon is a thin (e.g. between about 2 nm and about 20 nm thick) layer of high-purity amorphous boron. In some embodiments, one or more additional layers of material may be coated on the boron.

The thickness and material of each layer may be chosen to increase the transmission of a wavelength of interest into the image sensor. In one embodiment, an antireflective coating can be deposited on top of the boron layer. The antireflective coating material may comprise one or more of magnesium fluoride ($MgF_2$), hafnium oxide ($HfO_2$), strontium tetraborate ($SrB_4O_7$), silicon dioxide ($SiO_2$), silicon nitride ($Si_3N_4$), Titanium Oxide ($TiO_2$), and aluminum oxide ($Al_2O_3$).

The boron layer can be formed either using a high-temperature deposition process (e.g., between about 600° C. and 800° C.) or using a low-temperature deposition process (e.g., between about 350° C. and 450° C.) on clean silicon in a manner that produces a pin-hole free, contiguous, substantially pure boron layer having a thickness in the range of 2-5 nm (e.g., about 2 to 4 nm) including all ranges and values to the 0.1 nm therebetween. The boron layer circumvents silicon's oxidation problem by reliably and hermetically sealing the silicon surface against oxidation. Note that a few atomic percent of oxygen (such as less than 10% or less than 5%) may remain at the interface between the boron layer and the surface of the silicon, but that oxygen content likely will not significantly increase over time (such as over a time period of one year) because of the hermetic sealing. Such a low oxygen to silicon ratio means that there is no contiguous silicon dioxide layer at the interface.

The image sensors described herein may be fabricated using CCD (charge coupled device) or CMOS (complementary metal oxide semiconductor) technology. The image sensors may be two-dimensional area sensors, or one-dimensional array sensors.

Methods of fabricating image sensors with high-quantum-efficiency for imaging DUV and/or VUV are described. Image sensors fabricated according to these methods are capable of long-life operation under high fluxes of DUV and VUV radiation. These methods include process steps to form textured surface on a semiconductor (preferably silicon) wafer and deposit a layer of high-purity amorphous boron on top of the texturized silicon surface. An optional antireflective coating may be formed on top of the boron layer.

An inspection system is also described. This inspection system includes an illumination source, optics, and a detector. The optics are configured to direct and focus radiation from the illumination source onto a sample. The detector is configured to receive reflected or scattered light from the sample, wherein the optics are further configured to collect, direct, and focus the reflected or scattered light onto the detector. The detector can include one or more image sensors. At least one image sensor includes a semiconductor membrane, wherein the semiconductor membrane includes circuit elements formed on one surface of the semiconductor membrane and a boron-coated textured surface on the opposite surface of the semiconductor membrane. An optional antireflective coating may be formed on top of the boron layer FIG. 1 illustrates a simplified schematic view of a characterization system 100, in accordance with one or more embodiments of the present disclosure. In one embodiment, the characterization system 100 (or "tool") includes a characterization sub-system 101 and a controller 114. The characterization system 100 may be configured as an inspection system or a metrology system. For example, the characterization system 100 may be an optical-based inspection system (or "tool"), a review system (or "tool"), or an image-based metrology system (or "tool"). In this regard, the characterization sub-system 101 may be, but is not limited to, an inspection sub-system or a metrology sub-system configured to inspect or measure a sample 108. The characterization sub-system 101 of the characterization system 100 may be communicatively coupled to the controller 114. The controller 114 may receive measurement data from a detector assembly 104 of the characterization sub-system in order to characterize (e.g., inspect or measure) a structure on or in sample 108 and/or control one or more portions of the characterization system 100.

Sample 108 may include any sample known in the art such as, but not limited to, a wafer, reticle, photomask, or the like. In one embodiment, the sample 108 may be disposed on a stage assembly 112 to facilitate movement of the sample 108. The stage assembly 112 may include any stage assembly known in the art including, but not limited to, an X-Y stage, an R-θ stage, and the like. In another embodiment, the stage assembly 112 is capable of adjusting the height of the sample 108 during inspection to maintain focus on the sample 108. In yet another embodiment, characterization sub-system 101 may be moved up and down during inspection to maintain focus on the sample 108.

In another embodiment, the characterization system 100 includes an illumination source 102 configured to generate an illumination beam 111. The illumination source 102 may include any illumination source known in the art suitable for generating an illumination beam 111. For example, illumination source 102 may emit DUV and/or VUV radiation. For instance, the illumination source 102 may include one or more lasers. In another instance, the illumination source 102 may include a broadband illumination source.

In another embodiment, the characterization system 100 includes an illumination arm 107 configured to direct illumination from the illumination source 102 to the sample 108. The illumination arm 107 may include any number and type of optical components known in the art. In one embodiment, the illumination arm 107 includes one or more optical elements 103. In this regard, illumination arm 107 may be configured to focus illumination from the illumination source 102 onto the surface of the sample 108. It is noted herein that the one or more optical elements 103 may include any optical element know in the art including, but not limited to, one or more lenses (e.g., an objective lens 105), one or mirrors, one or more polarizers, one or more prisms, one or more beam splitters, and the like.

In another embodiment, a collection arm 109 is configured to collect illumination reflected, scattered, diffracted, and/or emitted from the sample 108. In another embodiment, the collection arm 109 may direct and/or focus the illumination from the sample 108 to a sensor 106 of a detector assembly 104.

Detector 104 may include one or more the image sensors 106 described herein. For example, the one or more image sensors 106 of the present disclosure may include, but are not limited to, boron-coated, textured-back-surface, back-illuminated CCD sensors, and boron-coated, textured-back-surface, back-illuminated CMOS sensors. Detector 104 may include a two-dimensional array sensor or a one-dimensional line sensor.

Some embodiments of inspection system 100 illuminate a line on sample 108, and collect scattered and/or reflected light in one or more dark-field and/or bright-field collection channels. In such embodiments, the image sensor may be a line sensor. Some embodiments of inspection system 100 illuminate multiple spots on sample 108, and collect scattered and/or reflected light in one or more dark-field and/or bright-field collection channels. In such embodiments, the image sensor may be a two-dimensional array sensor.

In another embodiment, the detector assembly 104 is communicatively coupled to one or more processors 116 of the controller 114. The one or more processors 116 may be communicatively coupled to memory 118. The one or more processors 116 are configured to execute a set of program instructions stored in memory 118 for acquiring measurement data from the one or more sensors 106 of the detector assembly 104 and/or controlling one or more portions of the characterization system 100.

In one embodiment, illumination source 102 is a continuous source. For example, the illumination source 102 may include, but is not limited to, an arc lamp, a laser-pumped plasma light source, or a continuous wave (CW) laser. In another embodiment, illumination source 102 is a pulsed source. For example, the illumination source 102 may include, but is not limited to, a mode-locked laser, a Q-switched laser, or a plasma light source pumped by a mode-locked or Q-switched laser. Examples of suitable light sources that may be included in illumination source 102 are described in U.S. Pat. No. 7,705,331, entitled "Methods and systems for providing illumination of a specimen for a process performed on the specimen", to Kirk et al., U.S. Pat. No. 9,723,703, entitled "System and method for transverse pumping of laser-sustained plasma", to Bezel et al., and U.S. Pat. No. 9,865,447, entitled "High brightness laser-sustained plasma broadband source", to Chuang et al, which are each incorporated by reference herein.

Characterization systems are generally are described in U.S. Pat. No. 9,891,177, entitled "TDI Sensor in a Darkfield System", to Vazhaeparambil et al., issued on Feb. 13, 2018; U.S. Pat. No. 9,279,774, entitled "Wafer Inspection", to Romanovsky et al., issued on Mar. 8, 2018; U.S. Pat. No. 7,957,066, entitled "Split Field Inspection System Using Small Catadioptric Objectives," to Armstrong et al., issued on Jun. 7, 2011; U.S. Pat. No. 7,817,260, entitled "Beam Delivery System for Laser Dark-Field Illumination in a Catadioptric Optical System," to Chuang et al., issued on Oct. 19, 2010; U.S. Pat. No. 5,999,310, entitled "Ultra-Broadband UV Microscope Imaging System with Wide Range Zoom Capability," to Shafer et al., issued on Dec. 7, 1999; U.S. Pat. No. 7,525,649, entitled "Surface Inspection System Using Laser Line Illumination with Two Dimensional Imaging," to Leong et al., issued on Apr. 28, 2009; U.S. Pat. No. 9,080,971, entitled "Metrology Systems and Methods," to Kandel et al., issued on Jul. 14, 2015; U.S. Pat. No. 7,474,461, entitled "Broad Band Objective Having Improved Lateral Color Performance," to Chuang et al., issued on Jan. 6, 2009; U.S. Pat. No. 9,470,639, entitled "Optical Metrology With Reduced Sensitivity To Grating Anomalies," to Zhuang et al., issued on Oct. 18, 2016; U.S. Pat. No. 9,228,943, entitled "Dynamically Adjustable Semiconductor Metrology System," to Wang et al., issued on Jan. 5, 2016; U.S. Pat. No. 5,608,526, entitled "Focused Beam Spectroscopic Ellipsometry Method and System," to Piwonka-Corle et al., issued on Mar. 4, 1997; and U.S. Pat. No. 6,297,880, entitled "Apparatus for Analyzing Multi-Layer Thin Film Stacks on Semiconductors," to Rosencwaig et al., issued on Oct. 2, 2001, all of which are incorporated herein by reference in the entirety.

It is noted that the scope of the present disclosure is not limited to the characterization system 100. Rather, the system incorporating the one or more image sensors of the present disclosure may include any other optical system known in the art including an inspection system, metrology system, or lithography system.

It is noted herein that the one or more components of system 100 may be communicatively coupled to the various other components of system 100 in any manner known in the art. For example, the one or more processors 116 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like).

The one or more processors 116 may include any one or more processing elements known in the art. In this sense, the one or more processors 116 may include any microprocessor-type device configured to execute software algorithms and/or instructions. The one or more processors 116 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 116. In general, the term "processor" may be broadly defined to encompass any device having one or more processing elements, which execute program instructions from memory 118. Moreover, different subsystems of the system 100 (e.g., illumination source 102, detector assembly 104, controller 114, and the like) may include processor or logic elements suitable for carrying out at least a portion of the steps described throughout the present disclosure. Therefore, the above description should not be interpreted as a limitation on the present disclosure but merely an illustration.

The memory 118 may include any storage medium known in the art suitable for storing program instructions executable by the associated one or more processors 116 and the data received from the metrology sub-system and/or inspection sub-system. For example, the memory 118 may include a non-transitory memory medium. For instance, the memory 118 may include, but is not limited to, a read-only memory (ROM), a random-access memory (RAM), a magnetic or optical memory device (e.g., disk), a magnetic tape, a solid-state drive and the like. It is further noted that memory 118 may be housed in a common controller housing with the one or more processors 116. In an alternative embodiment, the memory 118 may be located remotely with respect to the physical location of the processors 116, controller 114, and the like. In another embodiment, the memory 118 maintains program instructions for causing the one or more processors 116 to carry out the various steps described through the present disclosure.

FIG. 2 illustrates a flow diagram depicting a method 200 of fabricating an image sensor according to an exemplary embodiment of the present disclosure.

In step 201, front-side circuit elements are created without metal interconnects. Circuit elements can be created using one or more standard semiconductor processing steps, such as lithography, deposition, ion implantation, annealing, and/or etching. CCD and/or CMOS sensor elements and devices may also be created during step 201. These circuit elements may be created in an epitaxial (epi) layer on the front surface of the wafer and therefore are also called front-side circuit elements. In embodiments, the epitaxial layer is about 10 nm to 40 nm thick. In embodiments, both the epi layer and the substrate are doped with p-type dopants (e.g., boron), with the epi layer having a much lower dopant concentration than the bulk wafer. The epitaxial layer resistivity may be between 10 to 2000 $\Omega$cm, and the substrate resistivity may be less than about 1 $\Omega$cm.

In step 203, the active sensor area is back-thinned. For example, the active sensor areas or even the whole wafer may be thinned from the backside. This thinning may include a combination of polishing and etching to expose the epi layer. In embodiments, the wafer is polished from the backside until the wafer is about 200 nm to 300 nm thick. Then, the front surface and the frame areas around the active sensor areas are protected with a material, such as photoresist or other suitable material. In turn, a chemical etchant may be used to etch away the bulk wafer over the active sensor area, thereby exposing the active sensor area. Because the bulk wafer has a much higher dopant concentration and defect density than the epi layer, the etch rate of the bulk semiconductor material is much higher than that of the epi layer. The etch process slows down when it reaches the epi layer, thereby resulting in a uniform thickness membrane area. In another embodiment, the image sensor wafer is bonded to a support wafer, which might be made of quartz, silicon, sapphire or other material. Then, a polishing process, or a combination of a polishing process and a chemical etch process, may be used to polish the whole wafer until only the epi layer remains.

In step 205, a protective layer is deposited on the front-side surface to protect the front-side circuit elements during steps 207-213. For example, exposed silicon or poly-silicon on the front-side surface may be protected as subsequent etch and deposition steps may affect silicon. In embodiments, step 205 may be performed prior to step 203 so that the protective layer can provide additional protection for the front-side surface during the back-thinning process (step 203) or so that the protective layer can provide a planar surface for bonding to a support wafer. In embodiments, the protective layer may comprise a silicon nitride or other dielectric layer deposited, e.g., using plasma-enhanced CVD deposition.

In step 207, pseudo-random or periodic patterns are generated on the back-side surface of the wafer to provide surface texturing. In this step, the backside surface may be cleaned and prepared prior to generating a pseudo-random or periodic pattern used for surface texturing. For example, a pseudo-random or periodic texture pattern may be formed on the backside surface of the wafer via a mask/etch process. The patterning step may be used to generate periodic inverted pyramids, periodic upright pyramids, pseudo-random inverse pyramids, pseudo-random upright pyramids, periodic nanocones, pseudo-random nanocones, or the like. Details related to the production of various pattern structures are described in further detail in the description of FIGS. 3A-3I.

Alternatively and/or additionally, the back-side surface may be cleaned and prepared with pre-etch surface roughness for surface texturing. During this cleaning, native oxide and any contaminants, including organics and metals, should be removed from the back-side surface. In one preferred embodiment, the cleaning can be performed using a dilute HF solution or an RCA clean process (which is a well-known set of wafer cleaning steps including the removal of organic contaminants, the thin oxide layer, and ionic contamination). After cleaning and during preparation, the wafer is preferably dried using the Marangoni drying technique (surface tension based drying technology) or a similar technique to leave the surface dry and free of water marks. After cleaning, grits of different sizes may be used to remove a few hundred nm to a few μm of the wafer to generate appropriate pre-etch surface roughness, which may facilitate anisotropic wet etching.

In embodiments, the back-side surface is etched to create a pseudo-random, periodic and/or random textured surface. In embodiments, anisotropic wet etching may be used to generate pseudo-random, periodic and/or random surface textures on the silicon wafer. In preferred embodiments, alkaline solutions such as KOH including IPA can be used as the etchant. There is anisotropy in etch rates along different plane orientations. For instance, the etch rate along (100) plane is about 10 times faster than (111) planes. This leads to the formation of sharp pyramidal structures. The process of etching of crystalline silicon wafer using aqueous KOH is as follows. First, KOH is dissociated in water and K+ and OH⁻ ions are generated. Second, the OH– ions will attack the back bond generating H-terminated silicon surface. Then, the OH⁻ ions react with H-terminated silicon converting it to an OH-terminated surface. Finally, the surface silicon is removed either as $Si(OH)_6^{2-}$ or $K_2SiO_3$. Also, IPA acts as a surfactant to open up the surface sites. The etch rate depends on the presence of OH⁻ ion and $H_2O$ concentration, and its accessibility to the surface sites cleared by IPA.

Many recipes are possible for wet etching to generate the pseudo-random, periodic, pyramid surface, and/or random textures on the silicon wafer and can be used in the embodiments of the present disclosure. One recipe uses a solution of 6 (wt %) KOH in water with 4 (wt %) IPA to generate random upright pyramids. Photolithography may be used to pattern a mask on the silicon surface in order to enable etching of pseudo-random and/or periodic upright or inverted pyramids. A pattern created by lithography may have a pseudo-random structure, i.e. the pattern may appear random on short scale lengths, such as scale lengths less than a few microns, but the pattern may repeat on a scale length of tens of micron or longer.

A textured surface may reduce the reflection of incident light over wide spectral bandwidth, thus increasing the absorbed light intensity. U.S. Pat. No. 6,451,218 B1, issued on Sep. 17, 2002, and B. S. Akila, K. Vaithinathan, T. Balaganapathi, S. Vinoth, and P. Thilakan, Sensors and Actuators A-Physical 263, 445 (2017)) described such a phenomenon and are incorporated herein by reference in their entirety. In alternative embodiments, the texturing of the silicon surface may be achieved by one or more of wet chemical etching, reactive ion etching (RIE), ultra-fast laser etching, electrochemical etching, electron beam lithography and mechanical grooving. Wet chemical etching may be relatively inexpensive compared with other structuring methods.

Known techniques for the wet chemical pyramidal structural etching of (100)-oriented silicon surfaces use alkaline media, such as alkali hydroxides, alkali carbonates, ammonia or choline. The most common recipes comprise water, sodium or potassium hydroxide and alcohol. The alcohol component may be either ethylene glycol or isopropanol. The known methods for wet chemical structural etching of silicon merely relate to the generation of a pyramidal texture.

Surface texturing of silicon substrate removes the portion of material selectively creating either upright or inverted pyramidal structure depending on the specific texturization procedure. As a result, the material density may be reduced at the surface resulting in a reduced complex dielectric contrast, which gives rise to a wavelength-dependent reduction of surface reflection.

In embodiments, the upright or inverted pyramid surface textures or nanocone surface textures may also be fabricated by other methods, such as reactive ion etching (RIE) (with or without inductive coupling), ultra-fast laser etching, electrochemical etching, electron beam lithography and mechanical grooving.

In step 209, the back-side textured surface can be cleaned and prepared for boron deposition. During this cleaning, native oxide and any contaminants, including organics and metals, should be removed from the back-side surface. In one preferred embodiment, the cleaning can be performed using a dilute HF solution or an RCA clean process (which is a well-known set of wafer cleaning steps including the removal of organic contaminants, the thin oxide layer, and ionic contamination). After cleaning and during preparation, the wafer is preferably dried using the Marangoni drying technique (surface tension based drying technology) or a similar technique to leave the surface dry and free of water marks. In preferred embodiments, the wafer is protected in a controlled atmosphere during step 211 (using, e.g. dry nitrogen) to minimize native oxide regrowth before step 211.

In step 211, a boron layer is deposited on the textured backside surface. For example, an amorphous layer of pure boron may be deposited onto the textured silicon surface in order to hermetically seal the silicon and prevent oxidation. In embodiments, this deposition can be performed using a mixture of diborane and hydrogen gases at a temperature of about 600-800° C. to produce a pin-hole free, contiguous, substantially pure boron layer. In this embodiment, step 211 may further include diffusing boron into the textured silicon surface by raising the temperature to, for example, between 850° C. and 900° C. for between about two minutes and 10 minutes in order to create a p-type doped silicon layer adjacent to the boron layer. In an alternative embodiment, a pin-hole free, contiguous, substantially pure boron layer may be deposited using a mixture of diborane, hydrogen and nitrogen at a temperature between about 350° C. and about 450° C. In embodiments, a thin boron-doped epitaxial silicon layer may be grown on the silicon surface immediately prior to the deposition of boron. A detailed description of growing a thin boron-doped epitaxial silicon layer can be found in copending and commonly assigned U.S. patent application Ser. No. 16/562,396, entitled "Back-illuminated Sensor and Method of Manufacturing a Sensor," which is incorporated herein by reference in the entirety. The thickness of the boron layer may depend on the intended application for the sensor. Typically, the boron layer thickness is between about 2 nm and 20 nm including all ranges and values to the 0.1 nm therebetween. The boron layer may have a uniform thickness or may deposit differently on the pyramids versus the rest of the textured surface. The minimum thickness is generally limited by the need for a pinhole-free, uniform film. The maximum thickness generally depends on the absorption of the photons of interest by the boron. The boron layer circumvents silicon's oxidation problem by reliably and hermetically sealing the silicon surface against oxidation. Note that a few atomic percent of oxygen (such as less than 10% or less than 5%) may remain at the interface between the boron layer and the surface of the silicon, but that oxygen content likely will not significantly increase over time (such as over a time period of one year) because of the hermetic sealing. Such a low oxygen to silicon ratio means that there is no contiguous silicon dioxide layer at the interface. More details on boron deposition can be found in "*Chemical vapor deposition of a-boron layers on silicon for controlled nanometer-deep p+-n junction formation*," Sarubbi et al., J. Electron. Material, vol. 39, pp. 162-173, 2010, which is incorporated herein by reference in the entirety.

The term 'substantially pure boron layer' should be interpreted to mean that a majority of the layer is elemental boron. Some impurities, such as silicon or carbon, may be present either on the surface or in the lattice. For example, a boron silicide may be present at the interface between the boron layer and the substrate. Oxygen may be present in the bulk of the layer, but not in an easily detectable amount. Thus, the layer may comprise, consist of, or consist essentially of boron. The boron layer may be greater than 75%, greater than 80%, greater than 85%, greater than 90%, greater than 95%, greater than 96%, greater than 97%, greater than 98%, or greater than 99% boron.

The purity and lack of pinholes in the boron layer are critical to the sensitivity and lifetime of the image sensors disclosed herein. If any native oxide film is not removed from the epi layer surface before deposition of the boron, then that native oxide will be affected by DUV and VUV photons and will cause a degradation of sensor performance with use. Even if all the native oxide is removed prior to the boron deposition, if there are pinholes in the boron layer, then, after processing, oxygen will be able to reach silicon through those pinholes and may oxidize the surface of the silicon.

In embodiments, other layers can also be deposited on top of the boron layer during, or following, step 211. These other layers may include anti-reflection coatings comprised of one or more materials, such as magnesium fluoride ($MgF_2$), hafnium oxide ($HfO_2$), strontium tetraborate ($SrB_4O_7$), silicon dioxide ($SiO_2$), silicon nitride ($Si_3N_4$), titanium oxide ($TiO_2$) and aluminum oxide ($Al2O_3$). Even though the anti-reflection coating may be affected by DUV and VUV radiation, the presence of the boron layer between the anti-reflection coating and the epi layer shields the epi layer from charges and traps in the anti-reflection coating and ensures that the sensitivity of the image sensor does not significantly degrade.

In step 213, the protective layer is removed or patterned. For example, the protective layer may be removed, or holes or vias may be fabricated in the protective layer and/or support wafer to allow electrical connection to the circuit elements. In one embodiment, the support wafer may be removed. This step may include fabricating one or more of interconnects, vias and bond pads. These connections may be formed by Al, Cu, or another metal. A passivation layer may be deposited on the front-side surface to protect the circuit elements and connections.

In step 215, the completed circuit elements are packaged. The package may include flip-chip bonding or wire bonding of a chip to a substrate. The package may include a window that transmits wavelengths of interest, or may comprise a flange or seal for interface to a vacuum seal.

FIGS. 3A-3I illustrate various pseudo-random and periodic pattern approaches for implementation within embodiments of the image sensor, in accordance with one or more embodiments of the present disclosure.

Figure 3A:
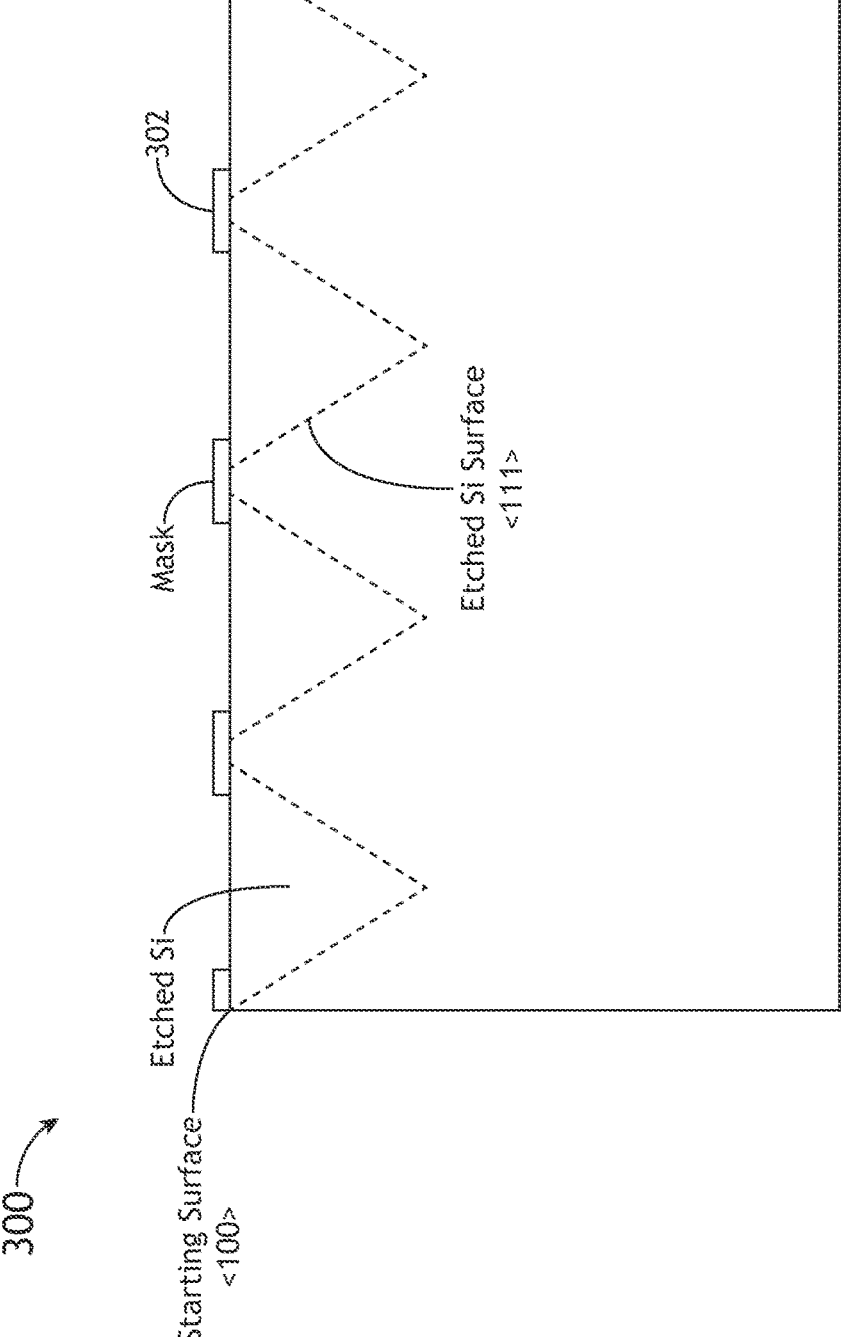

FIG. 3A illustrates a surface 300 patterned via a mask and etching process, in accordance with one or more embodiments of the present disclosure. In this embodiment, anisotropic wet etching of a surface of the wafer is performed via mask 302. The mask 302 may be a photoresist, polymer, or hard mask, such as SiN mask. The wet etching process may include alkaline etch recipes such as KOH, TMAH, or the like. During this process, the etching attacks <111> surfaces of the Si lattice of the wafer. This results in etching under the mask as the <111> faceted pyramids show up due to preferential <111> plane etch. This etching will be continued until the bottom of the pyramid and the top of the pyramid become as small as possible. Finally, once etch is completed the mask will be removed. Polymer or photoresist masks can be removed using solvents, and hard mask such SiN can be removed using HF solution. The Si surface can later be cleaned using standard silicon surface cleaning methods (e.g., RCA cleans with HF etched in between to remove the surface oxide that grows during the clean) to remove any remaining residue. Photosensitive etch protection is discussed in J Dalvi-Malhotra, et. al., *A spin-on photosensitive polymeric etch protection mask for anisotropic wet etching of silicon*, J. Micromech. Microeng. 18 (2008) 025029 (8pp), which is incorporated by reference in the entirety. The upright nanopyramids are discussed in Puqun Wang, et. al., *Periodic upright nanopyramids for light management applications in ultrathin crystalline silicon solar cells*, IEEE Journal of Photovoltaics, Vol. 7, No. 2, March 2017, which is incorporated by reference in the entirety. Wet etching of Silicon is discussed in Miguel A. Gonsalves et. al., *Chapter 22—Wet Etching of Silicon, Handbook of Silicon Based MEMS Materials and Technologies (Second Edition)*, Micro and Nano Technologies, 2015, Pages 470-502, which is incorporated herein by reference in the entirety.

Figure 3B:
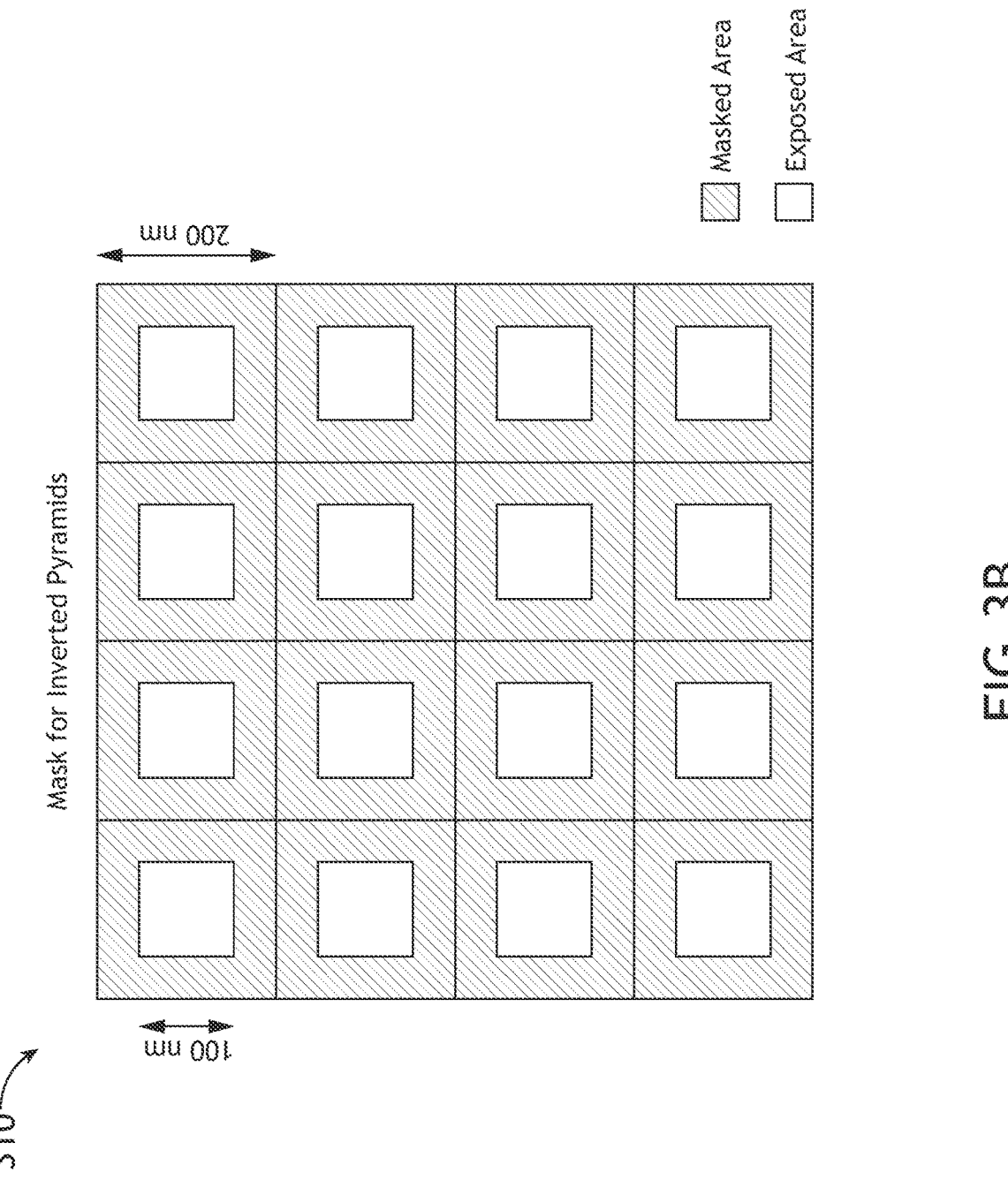

FIG. 3B illustrates a mask 310 suitable for generating inverted pyramids on the surface 300 of the wafer, in accordance with one or more embodiments of the present disclosure. In this embodiment, the opening size chosen is approximately 100 nm with each exposed area placed 200 nm apart. It is noted that the scope of the present disclosure is not limited to this opening size or spacing, which are provided merely for illustrative purposes. The opening size can vary depending on the patterning method used. The patterning may be obtained by utilizing advanced photolithography tools that may or may not utilize near field optics to obtain smaller features. The pattern may also be generated utilizing electron beam lithography.

Figure 3C:
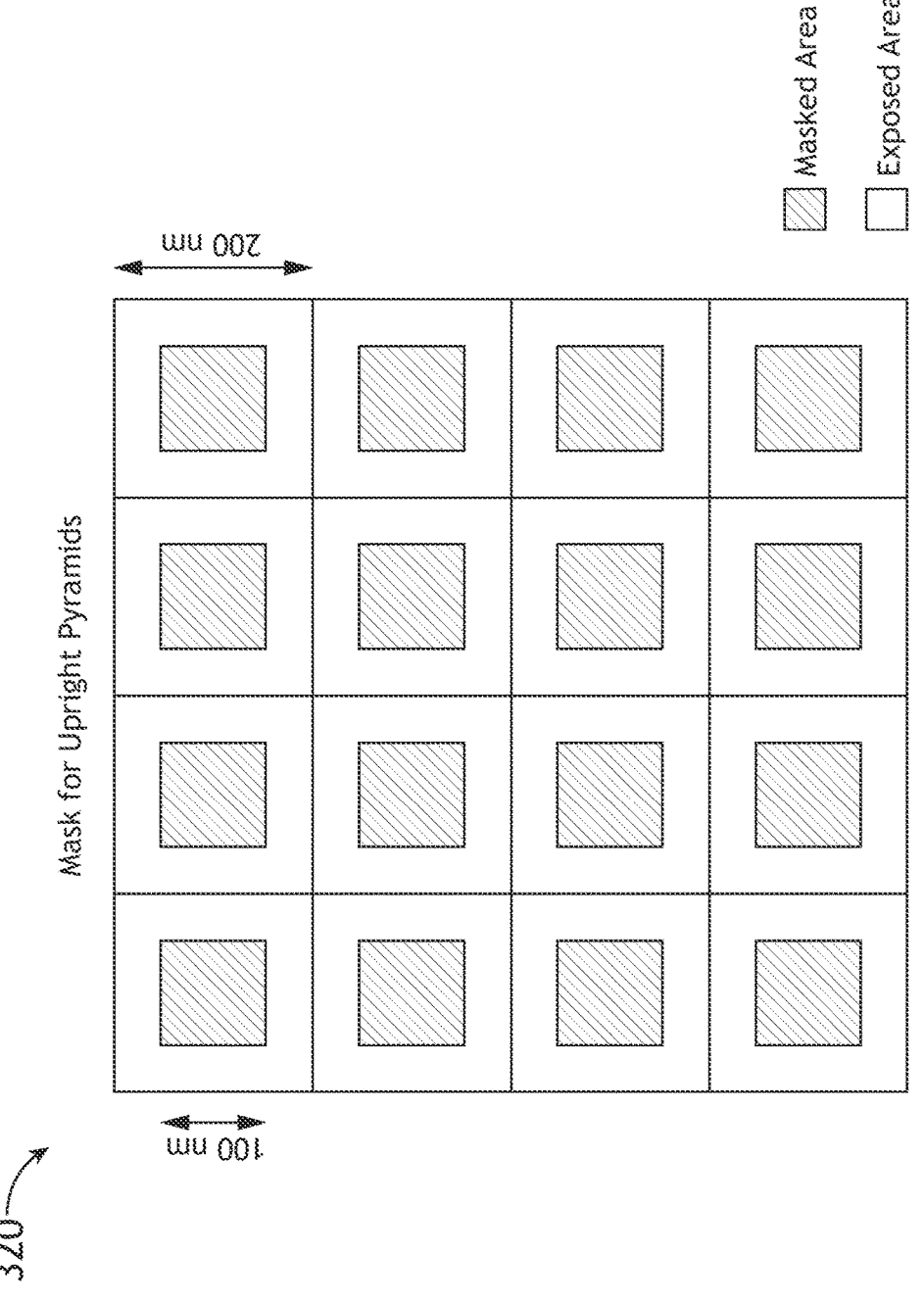

FIG. 3C illustrates a mask 320 suitable for generating upright pyramids on the surface 300 of the wafer, in accordance with one or more embodiments of the present disclosure. It is noted that the pattern of mask 320 is the inverse of the pattern of mask 310 depicted in FIG. 3B. It is noted that the methods of production and dimensions of mask 310 may be extended to mask 320.

Figure 3D:
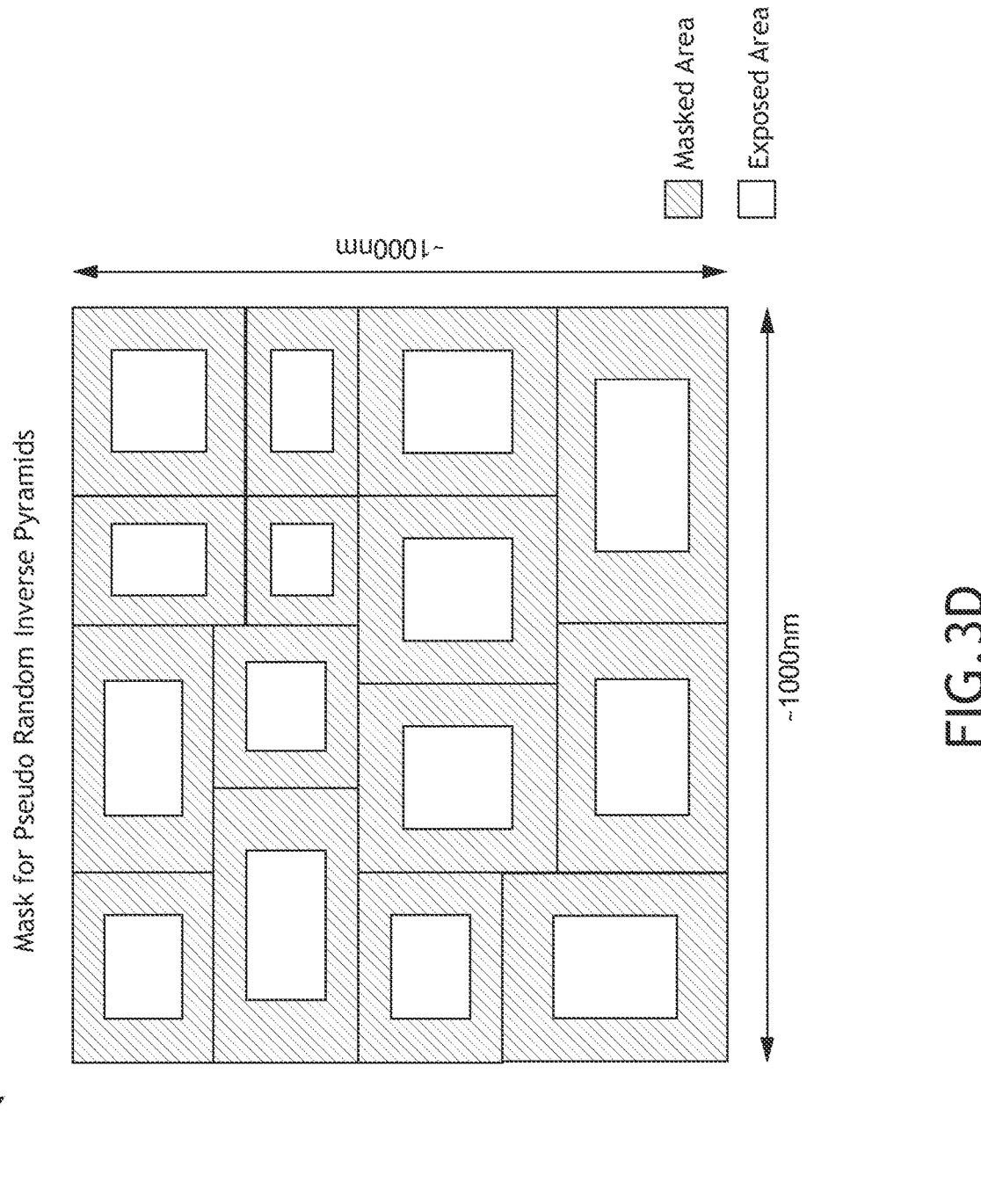

FIG. 3D illustrates a mask 330 suitable for generating pseudo-random inverse pyramids on the surface 300 of the wafer, in accordance with one or more embodiments of the present disclosure. It is noted that the methods of fabrication of mask 310 may be extended to mask 330. For the purpose of the present disclosure a pseudo-random pattern is defined as any pattern that lack clear short-range order, but displays long range order. FIG. 3D is an illustration of one such pattern where the average inverse pyramid size that may be obtained is approximately 200 nm, but in order to identify periodicity in the pattern one must look at a larger area such as a length scale of approximately 1000 nm. This long-range order can be even larger with a unit cell that can be as large as a mm or a cm or even more. It is noted that the scope of the present disclosure is not limited to the opening size of approximately 200 nm or long-range order scale depicted in FIG. 3D, which are provided merely for illustrative purposes.

Figure 3E:
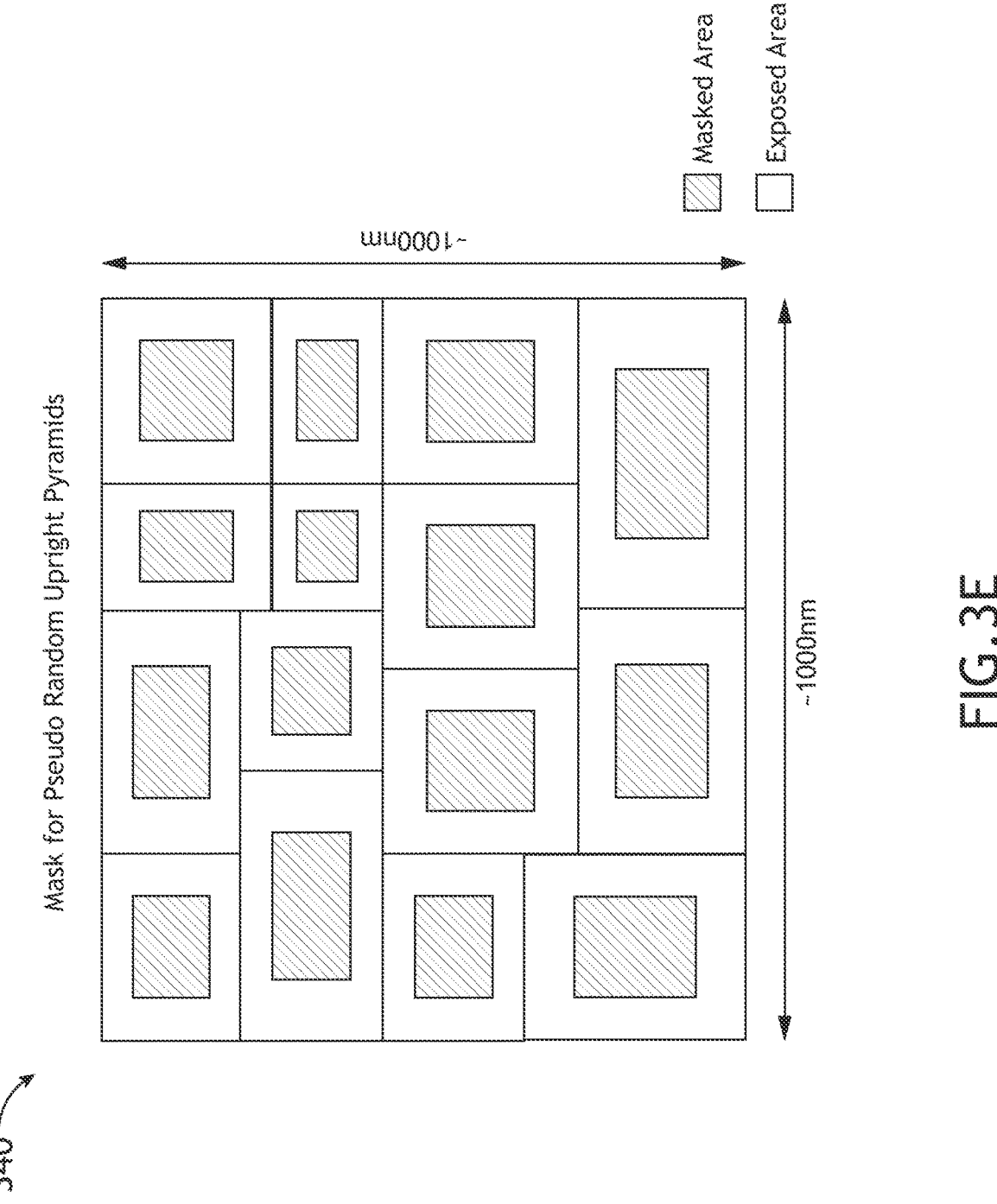

FIG. 3E illustrates a mask 340 suitable for generating pseudo-random upright pyramids on the surface 300 of the wafer, in accordance with one or more embodiments of the present disclosure. It is noted that the pattern of mask 340 is the inverse of the pattern of mask 330 depicted in FIG. 3D. It is noted that the methods of production and dimensions of mask 330 may be extended to mask 340.

Figure 3F:
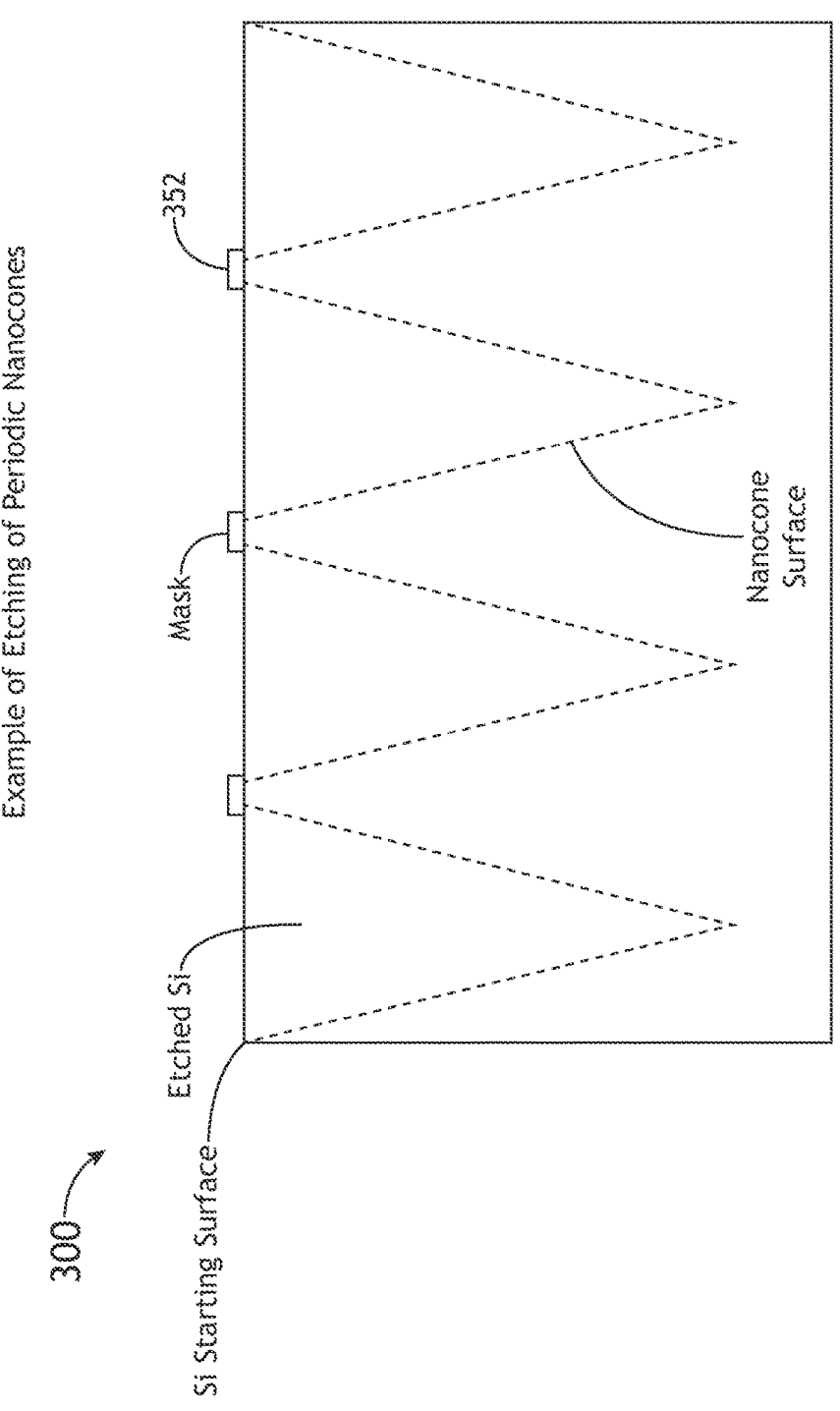

FIG. 3F illustrates the surface 300 including periodic nanocones patterned via a mask 352 and etching process, in accordance with one or more embodiments of the present disclosure. This type of etching can be obtained by masking a silicon surface with photoresist masks or hard masks such as silicon dioxide or aluminum oxide, or the like, which have a lower etch selectivity compared to Si. The pattern may be defined by electron beam lithography or advanced lithography with multiple patterning. Etching can be performed via reactive ion etching (RIE) or inductively coupled reactive ion etching (ICPRIE) utilizing etch chemistries such as $SF_6/C_4F_8$ or $SF_6/O_2$ or the like. The nanocone side wall slope may be varied via varying process conditions such as plasma power, gas mixture ratios, or temperature of the substrate during etch. Etch recipes are described in: Zhang et al., *Highly-ordered silicon inverted nanocone arrays with broadband light antireflectance*, Nanoscale Research Letters (2015) 10:9; Yalamanchili S., et. al., *Enhanced absorption and <1% spectrum-and-angle-averaged reflection in tapered microwire arrays*, ACS Photonics 2016, 3, 10, 1854-1861; Dasog M., *Profiling photoinduced carrier generation in semiconductor microwire arrays via photoelectrochemical metal deposition*, Nano Lett. 2016, 16, 8, 5015-5021, which are each incorporated by reference herein in their entirety.

Figure 3G:
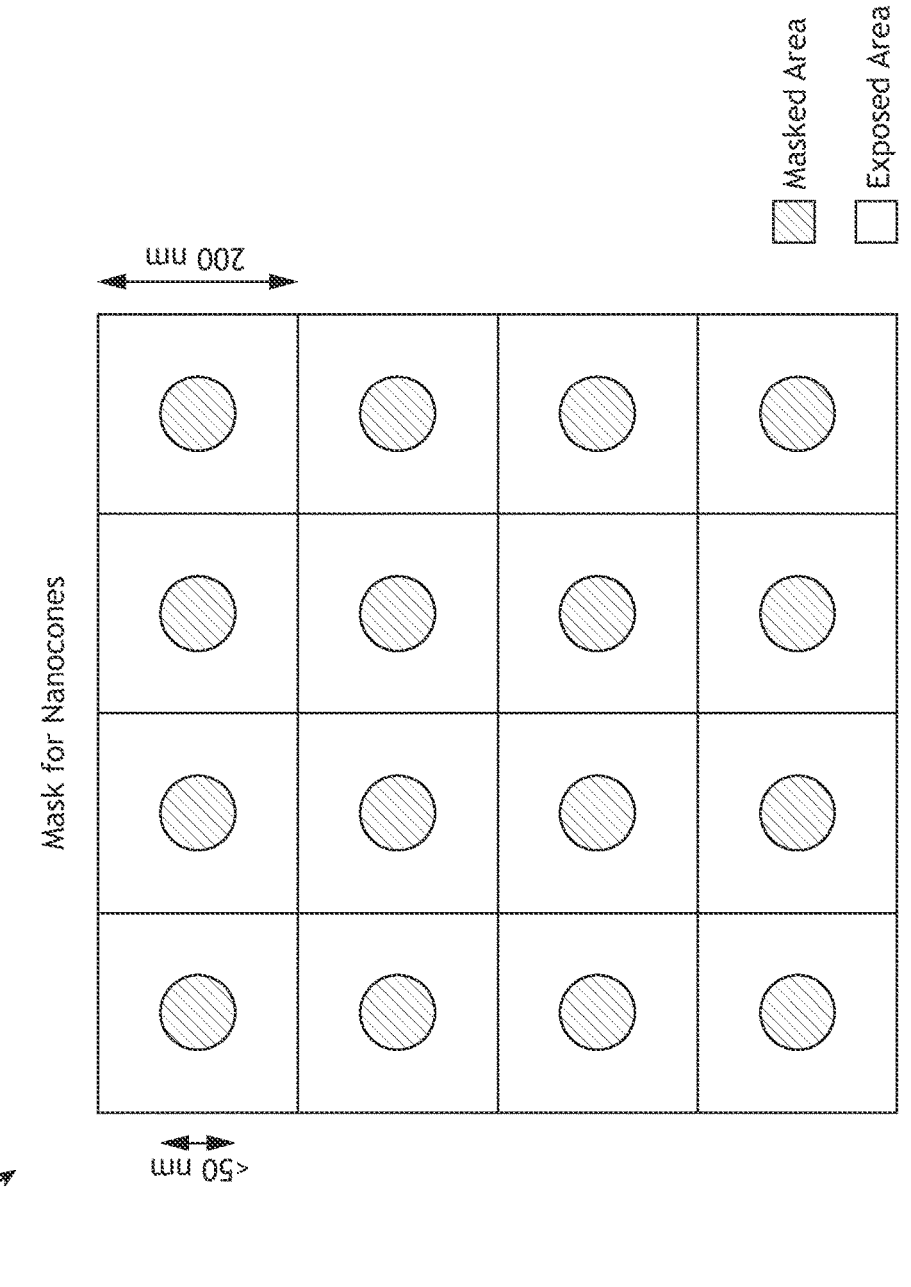

FIG. 3G illustrates a mask 360 suitable for generating periodic nanocones on the surface 300 of the wafer, in accordance with one or more embodiments of the present disclosure. In this embodiment, the opening size is less than approximately 50 nm with each exposed area placed approximately 200 nm apart. It is noted that the scope of the present disclosure is not limited to this opening size or spacing, which are provided merely for illustrative purposes. The opening size can vary depending on the patterning method used. In embodiments, the masked area could be defined by electron beam lithography by depositing $Al_2O_3$ into the holes of a patterned resist and then followed by a resist liftoff process to remove the resist resulting in a pattern shown.

Figure 3H:
Figure 31:
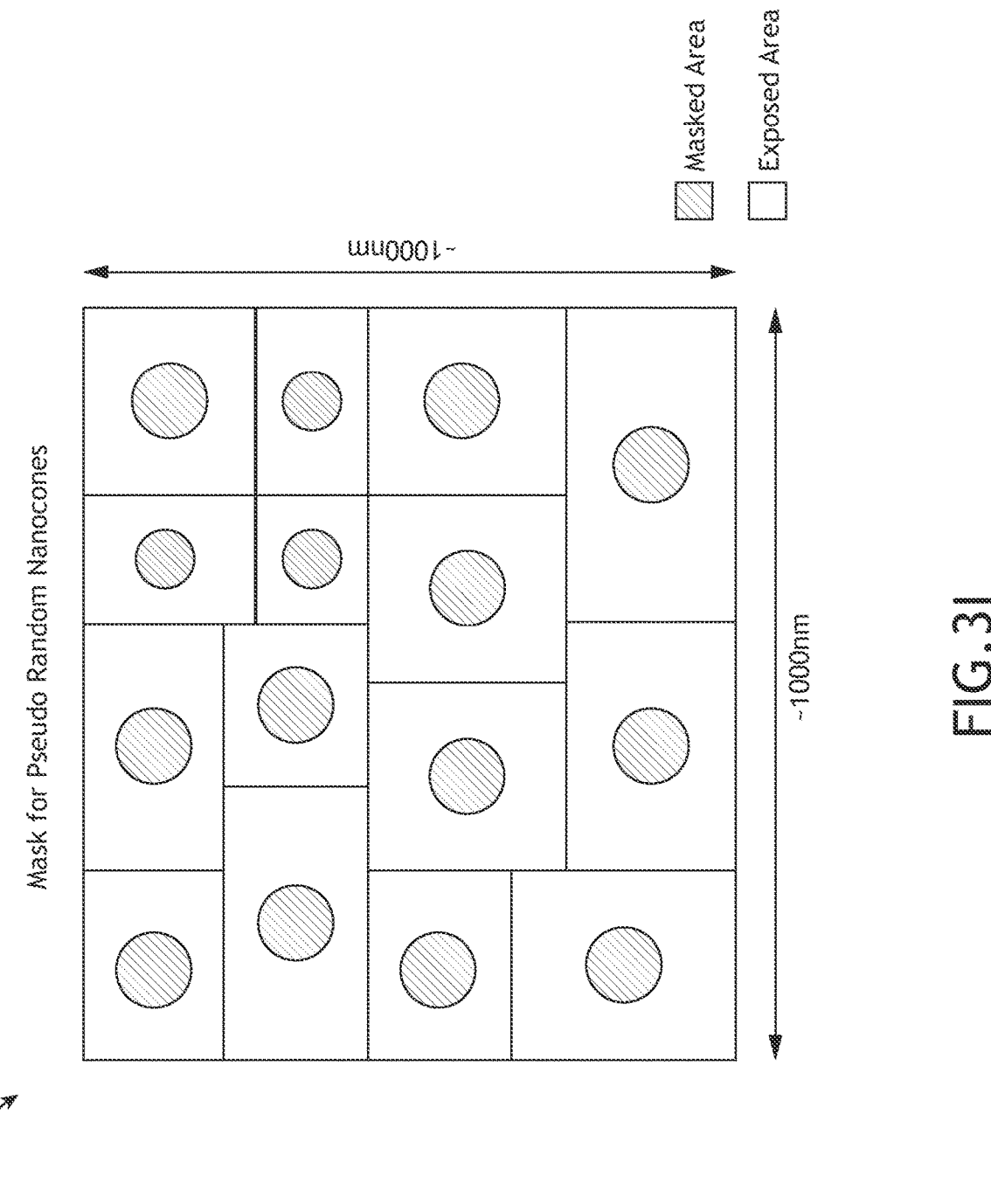

FIG. 3H illustrates the surface 300 including pseudo-random nanocones patterned via a mask 354 and etching process, in accordance with one or more embodiments of the present disclosure. It is noted that the pseudo-random nanocones of FIG. 3H may be obtained by etching recipes similar to the periodic pattern in FIG. 3F, but with a pseudo-random etch mask (e.g., mask that may be defined by electron beam lithography). Due to differences in the masked area sizes the nanocones may have a small variation in their heights and widths.

FIG. 3I illustrates a mask 380 suitable for generating pseudo-nanocones on the surface 300 of the wafer, in accordance with one or more embodiments of the present disclosure. It is noted that the methods of fabrication of mask 360 may be extended to mask 380. FIG. 3I is an illustration a pseudo-random pattern where the average nanocone size that may be obtained is approximately less than 50 nm, but in order to identify periodicity in the pattern one must look at a larger area such as a length scale of approximately 1000 nm. It is noted that the scope of the present disclosure is not limited to the opening size of approximately less than 50 nm or long-range order scale depicted in FIG. 3I, which are provided merely for illustrative purposes.

Figure 4A:
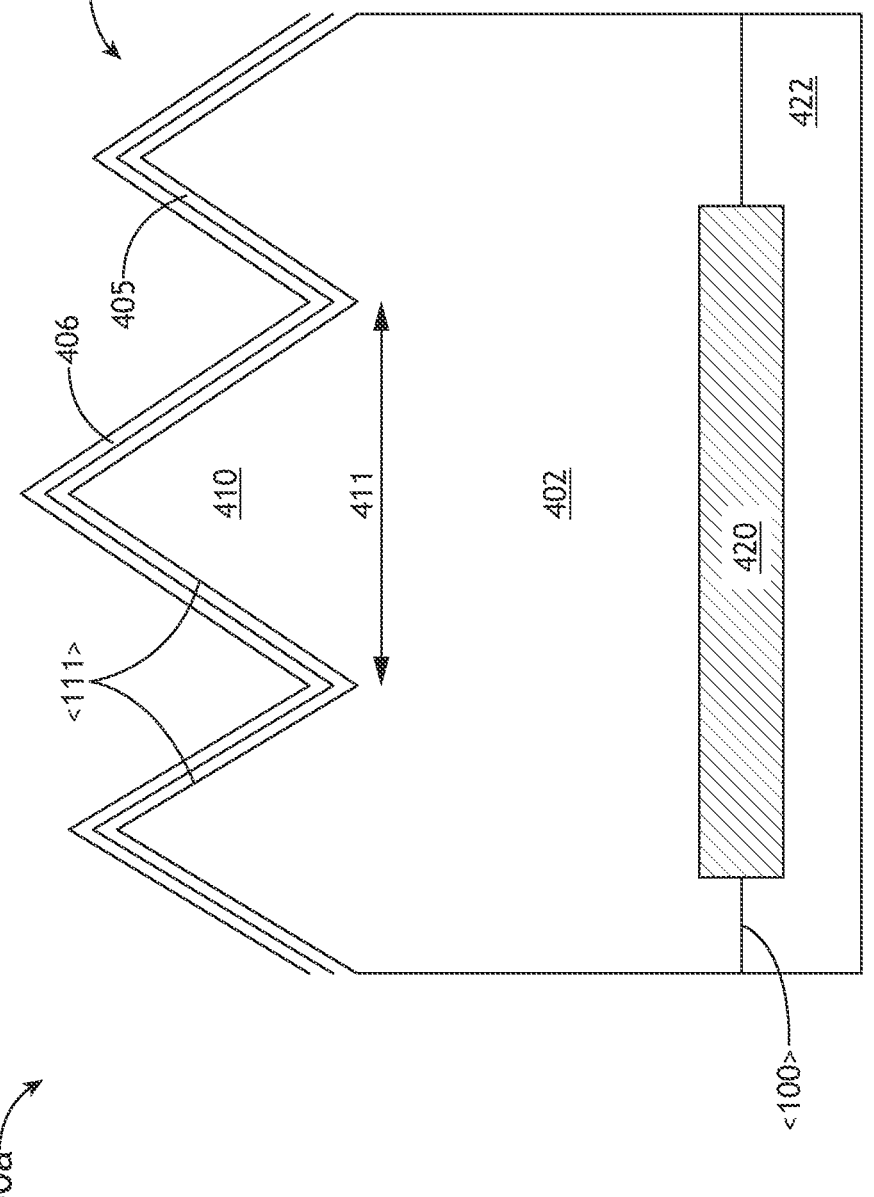
FIG. 4A illustrates a cross-section view of a portion of an image sensor with a low-reflectivity back-illuminated boron-coated textured back surface, in accordance with one or more embodiments of the present disclosure.

FIG. 4A illustrates a cross-section view of a portion of an image sensor 400a with a low-reflectivity back-illuminated boron-coated textured back surface 404, in accordance with one or more embodiments of the present disclosure. Note that FIG. 4A is not drawn to scale as some features are exaggerated for purposes of clarity. In embodiments, a silicon wafer is processed by one of the methods described herein. In embodiments, circuit elements 420 are fabricated on a first surface of an epitaxial silicon layer 402. In embodiments, a protective layer 422 is applied to protect circuit elements 420. Protective layer 422 is described previously herein and may include a support wafer bonded to the first surface of the epitaxial silicon layer. In this embodiment, the textured surface 404 including a pseudo-random, periodic, and/or random distribution of upright pyramids 410 covers light-sensitive portions of a second surface of the epitaxial silicon layer. This textured surface 404 causes the material density to be reduced at the surface resulting in a reduced complex dielectric contrast, which gives rise to a wavelength-dependent reduction of surface reflection, thereby increasing the amount of light absorbed and improving the reflectance and thus the efficiency of the image sensor.

In this example, the plane of the first surface of epitaxial silicon layer 302 prior to fabrication of circuit elements is of a (100) plane orientation (or any of the planes belonging to the family of planes <100>) as represented in the drawing. After etching, the second surface of epitaxial silicon layer includes multiple faceted pyramidal peaks. Specifically, these upright pyramids 410 have triangular sides of (111) planes (or any of the planes belonging to the family of planes <111>) and bases along the (100) plane as shown in the drawing. Note that even if one or more sides of a pyramid are not completely or precisely aligned with a <111> plane, the reflectivity can be reduced as intended. In embodiments, an image sensor 400a may be optimized for high sensitivity over a wavelength range from about 190 nm to about 450 nm. In this embodiment, a typical linear dimension 411 of a base of a pyramid is about 200 nm. Since the textured back surface 404 comprises a pseudo-random, periodic, and/or random distribution of pyramids, some pyramids may have bases larger than this typical linear dimension and some pyramids will have bases smaller than this typical linear dimension. For example, approximately 80% or more of the pyramids may have linear dimensions between 150 nm and 300 nm. Different typical linear dimensions may be used in sensors optimized for other wavelength ranges. Typical linear dimensions of the pyramids may be controlled by adjusting one or more etch conditions such as etchant concentration, temperature and/or etch time. Although FIG. 4A depicts the pyramid bases as aligned at the same distance from the first surface of epitaxial silicon layer 402, it is noted that the scope of the present disclosure is no limited to this alignment and is provided for convenience. In practice, the pyramids of the surface 404 may not be precisely aligned.

In embodiments, a thin (e.g., between about 2 nm and about 20 nm thick) layer of high-purity amorphous boron 405 is deposited on the textured silicon 404. This boron layer 405 hermetically seals the textured silicon and prevents or limits oxidation. The boron layer 405 can be formed as described previously herein. For example, the boron layer 405 may be approximately 5 nm thick (or about 20 to 25 atomic layers of boron). The boron layer 405 may have a uniform thickness or may deposit differently on the pyramids versus the rest of the textured surface.

In embodiments, an antireflective coating 406 may be applied to the textured surface 404 to further reduce reflectance. The antireflective coating may comprise one or more of magnesium fluoride ($MgF_2$), hafnium oxide ($HfO_2$), strontium tetraborate ($SrB_4O_7$), silicon dioxide ($SiO_2$), silicon nitride ($Si_3N_4$), titanium oxide ($TiO_2$) and aluminum oxide ($Al_2O_3$).

It is noted that the textured silicon surface 404 described herein may be produced on any type of silicon surface condition. For example, sawed, etched, lapped and polished surfaces can be treated to obtain the desired textured silicon surface 404.

Figure 4B:
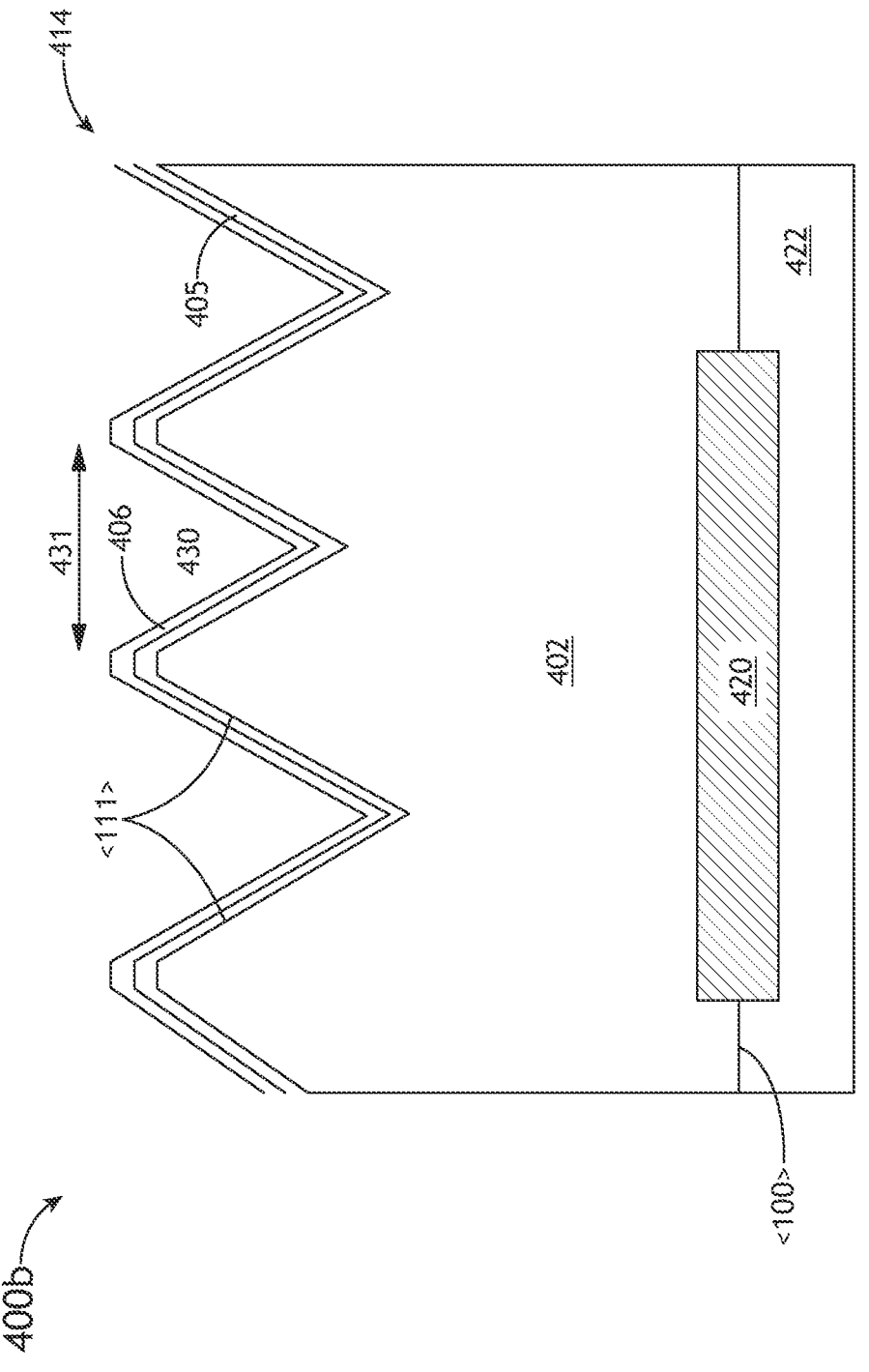
FIG. 4B illustrates a cross-section view of a portion of an image sensor with a low-reflectivity back-illuminated boron-coated textured back surface, in accordance with one or more additional embodiments of the present disclosure.

FIG. 4B illustrates a cross-section view of a portion of an image sensor 400b with a low-reflectivity back-illuminated boron-coated textured back surface 414, in accordance with one or more additional embodiments of the present disclosure. It is noted that the description of FIG. 4A should be interpreted to extend to FIG. 4B unless otherwise noted. In embodiments, circuit elements 420 are fabricated on a first surface of an epitaxial silicon layer 402. In embodiments, a protective layer 422 is deposited on the first surface and protects circuit elements 420. Protective layer 422 is described previously and may include a support wafer bonded to the first surface of the epitaxial silicon layer. The textured surface 414 comprising a pseudo-random, periodic, and/or random distribution of inverted pyramids 430 covers light-sensitive portions of a second surface of the epitaxial silicon layer. This textured surface 414 causes the material density to be reduced at the surface resulting in a reduced complex dielectric contrast, which gives rise to a wavelength-dependent reduction of surface reflection, thereby increasing the amount of light absorbed and improving the reflectance and thus the efficiency of the image sensor.

The plane of the first surface of epitaxial silicon layer 402 prior to fabrication of circuit elements is of a (100) plane orientation (or any of the planes belonging to the family of planes <100>) as represented in the drawing. After etching, the second surface of epitaxial silicon layer comprises a number of faceted inverted pyramidal structures. Specifically, these inverted pyramids 430 have triangular sides of (111) planes (or any of the planes belonging to the family of planes <111>) and bases along the (100) plane as shown in the drawing. Note that even if one or more sides of an inverted pyramid are not completely or precisely aligned with a <111> plane, the reflectivity can be reduced as intended. In embodiments, the image sensor 440b is optimized for high sensitivity over a wavelength range from about 190 nm to about 450 nm. In this embodiment, a typical linear dimension 431 of a base of an inverted pyramid is about 200 nm. Since the textured back surface 414 comprises a pseudo-random, periodic, and/or random distribution of inverted pyramids, some inverted pyramids may have bases larger than this typical linear dimension and some inverted pyramids will have bases smaller than this typical linear dimension. For example, approximately 80% or more of the pyramids may have linear dimensions between 150 nm and 300 nm. Different typical linear dimensions may be used in sensors optimized for other wavelength ranges. Typical linear dimensions of the inverted pyramids may be controlled by adjusting one or more etch conditions such as etchant concentration, temperature and etch time. Note that although FIG. 4B depicts the bases of inverted pyramids such as 430 as aligned at a single height, it is anticipated that some of the inverted pyramids may have bases at different heights, and this would not significantly affect the low reflectivity of textured surface 414.

Similar to FIG. 4A, a thin (e.g., between about 2 nm and about 20 nm thick) layer of high-purity amorphous boron 405 may be deposited on the textured silicon 414. This boron layer 405 hermetically seals the textured silicon and prevents or limits oxidation. The boron layer 405 can be formed as described above in relation to FIG. 2. The boron layer 405 may be, for example, 5 nm thick or about 20 to 25 atomic layers of boron. The boron layer 405 may have a uniform thickness or may deposit differently on the inverted pyramids versus the rest of the textured surface.

In embodiments, an antireflective coating 406 may be applied to the textured surface 404 to further reduce reflectance. The antireflective coating may comprise one or more of magnesium fluoride ($MgF_2$), hafnium oxide ($HfO_2$), strontium tetraborate ($SrB_4O_7$), silicon dioxide ($SiO_2$), silicon nitride ($Si_3N_4$), titanium oxide ($TiO_2$) and aluminum oxide ($Al_2O_3$).

Figure 4C:
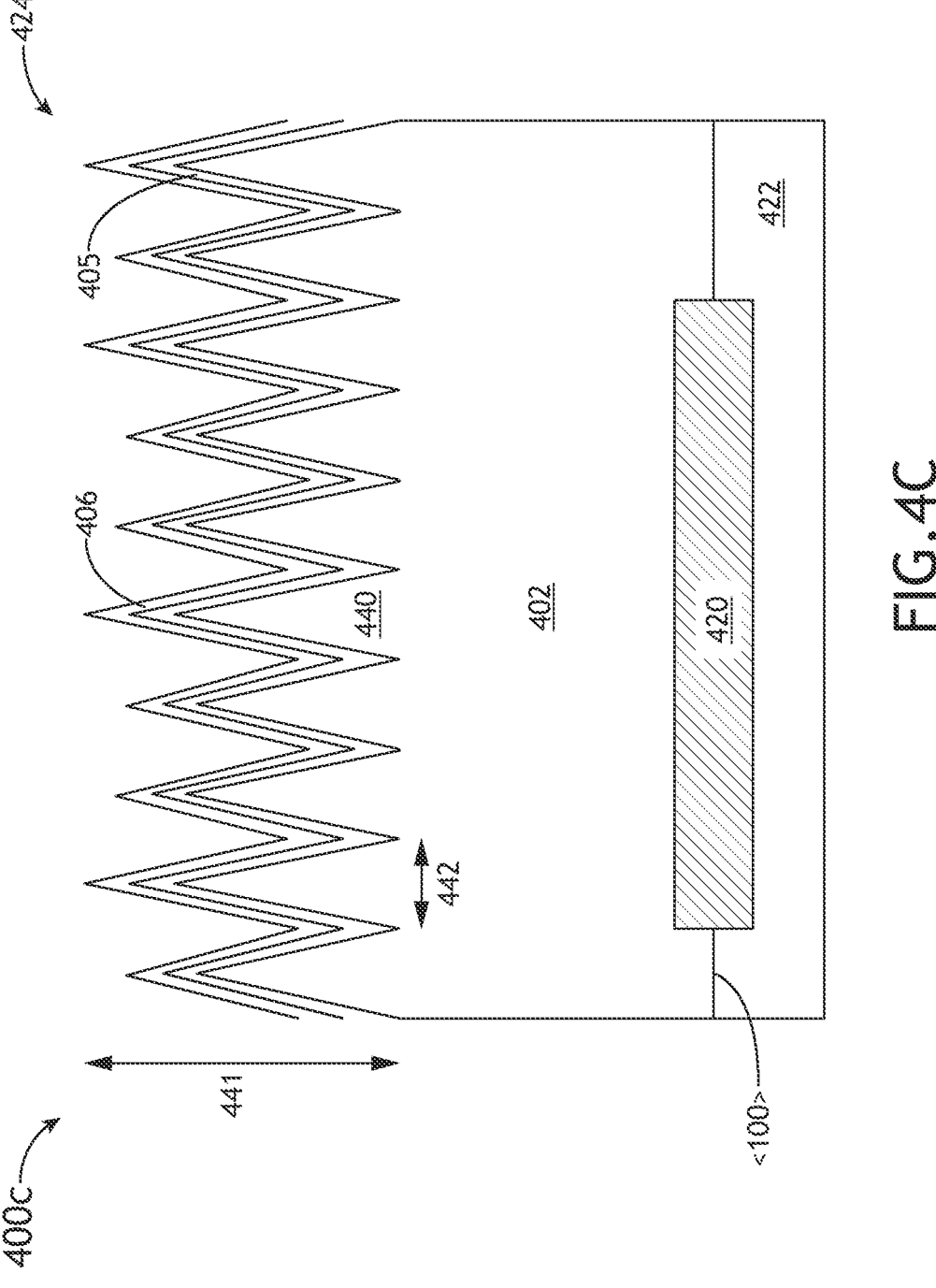
FIG. 4C illustrates a cross-section view of a portion of an image sensor with a low-reflectivity back-illuminated boron-coated textured back surface, in accordance with one or more additional embodiments of the present disclosure.

FIG. 4C illustrates a cross-section view of a portion of an image sensor 400c with a low-reflectivity back-illuminated boron-coated textured back surface 424, in accordance with one or more additional embodiments of the present disclosure. It is noted that the description of FIG. 4A and FIG. 4B should be interpreted to extend to FIG. 4C unless otherwise noted. In embodiments, circuit elements 420 are fabricated on a first surface of an epitaxial silicon layer 402. In embodiments, is deposited on the first surface and protects circuit elements 420. Textured surface 424 comprising a pseudo-random, periodic and/or random distribution of nanocones (e.g., black silicon) 440 covers at least the light-sensitive portions of a second surface of the epitaxial silicon layer. This textured surface 424 causes the material density to be reduced at the surface resulting in a reduced complex dielectric contrast, which gives rise to a wavelength-dependent reduction of surface reflection, thereby increasing the amount of light absorbed and improving the reflectance and thus the efficiency of the image sensor.

In embodiments, a thin (e.g. between about 2 nm and about 20 nm thick) layer of high-purity amorphous boron 405 is deposited on the textured silicon 424. As noted previously herein, this boron layer 405 hermetically seals the textured silicon and prevents or limits oxidation. The boron layer 405 can be formed as described previously herein. For example, the boron layer 405 may be 5 nm thick, or about 20 to 25 atomic layers of boron. The boron layer 405 may have a uniform thickness or may deposit differently on the inverted pyramids versus the rest of the textured surface.

In embodiments, an antireflective coating 406 may be applied to the textured surface 404 to further reduce reflectance. The antireflective coating may comprise one or more of magnesium fluoride ($MgF_2$), hafnium oxide ($HfO_2$), strontium tetraborate ($SrB_4O_7$), silicon dioxide ($SiO_2$), silicon nitride ($Si_3N_4$), titanium oxide ($TiO_2$) and aluminum oxide ($Al_2O_3$).

In embodiments, the image sensor 400c is optimized for high sensitivity over a wavelength range from about 190 nm to about 450 nm. In this embodiment, a typical height 441 of a nanocone is about 700 nm and a typical radius 442 of a base of a nanocone is about 120 nm. The tips of the nanocones have radii much smaller than a typical radius of a base. For example, the tips may have radii of about 30 nm or smaller. Since the textured back surface 424 comprises pseudo-random, periodic, and/or random distribution of nanocones, some nanocones may have heights larger or smaller than 700 nm and radii of their bases larger or smaller than 120 nm. For example, approximately 80% or more of the nanocones may have heights between 350 nm and 1000 nm, and approximately 80% or more of the nanocones may have radii of their bases between 80 nm and 160 nm. Different typical dimensions may be used in sensors optimized for other wavelength ranges. Typical dimensions of the nanocones may be controlled by adjusting one or more etch conditions such as etchant concentration, plasma conditions, temperature and etch time. Note that although FIG. 4C depicts the bases of nanocones such as 440 as aligned at a single height, it is anticipated that some of the nanocones may have bases at different heights, and this would not significantly affect the low reflectivity of textured surface 424.

Figure 5:
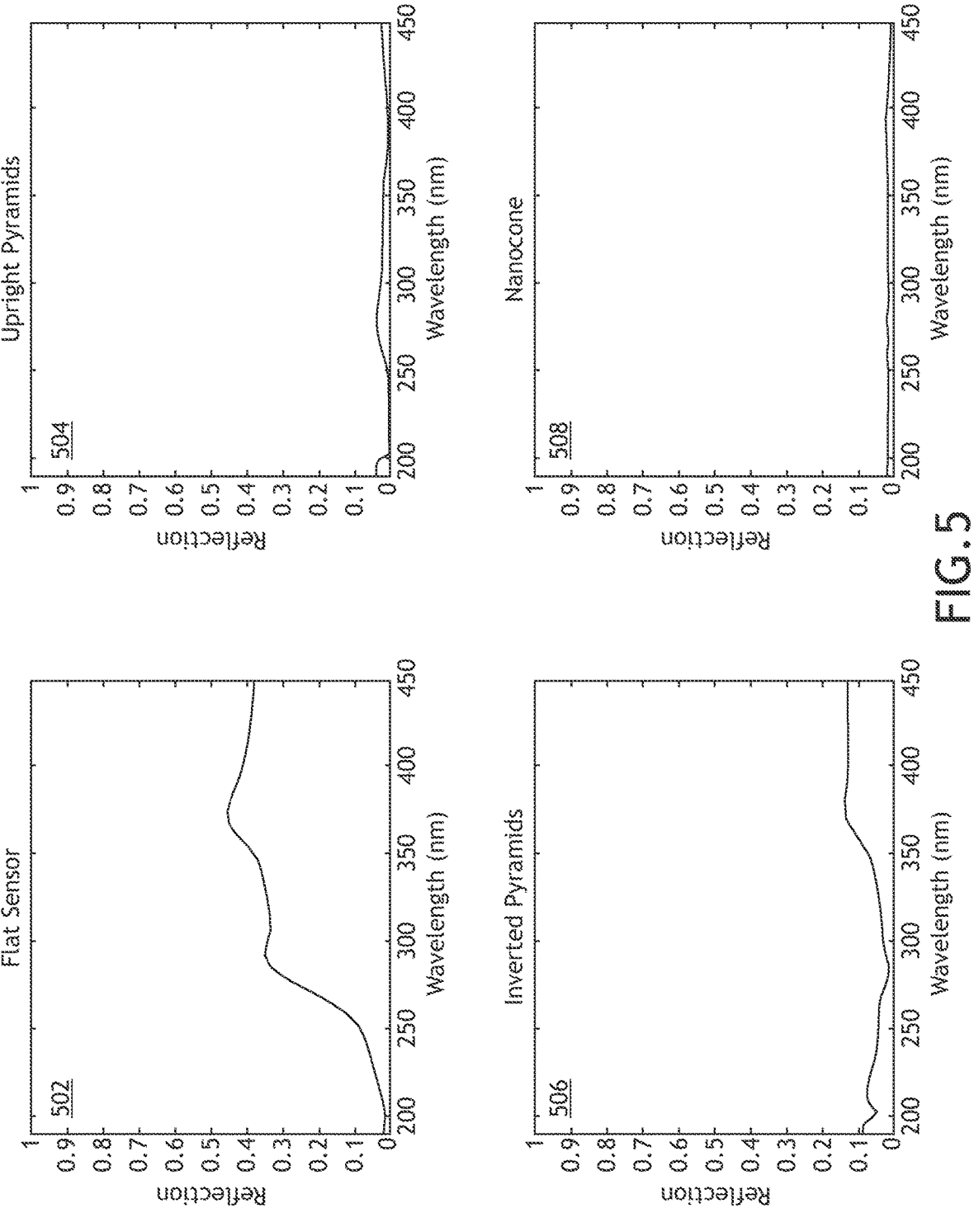
FIG. 5 illustrates graphs depicting reflectance versus wavelength for various image sensors.

FIG. 5 illustrates graphs 502-508 depicting reflectance versus wavelength for various image sensors. Graph 502, as a reference case, depicts reflectance versus wavelength behavior of an image sensor with a back-illuminated boron-coated flat back surface. Graph 504 depicts reflectance versus wavelength behavior for an image sensor with low-reflectivity back-illuminated boron-coated back surfaces with an upright pyramid texture. Graph 506 depicts reflectance versus wavelength behavior for an image sensor with low-reflectivity back-illuminated boron-coated back surfaces with an inverted pyramid texture. Graph 508 depicts reflectance versus wavelength behavior for an image sensor with low-reflectivity back-illuminated boron-coated back surfaces with a nanocone texture. The reflectance values were simulated using Lumerical FDTD for periodic upright pyramids, inverted pyramids and nanocones. It is assumed that the incident light is in a direction normal to the plane of the silicon substrate and consists of equal parts of transverse electric and transverse magnetic wavefronts. Each simulation includes a uniform 5 nm layer of boron on top of the silicon. The simulations of the flat sensor surface, of the textured sensor surface with upright pyramids, and of the textured sensor surface with inverted pyramids include aluminum oxide coatings on top of the boron layer with thicknesses of 16.5 nm, 48 nm and 41 nm respectively. FIG. 5 demonstrates how reflectance for wavelengths between 190 nm and 450 nm may be improved. The reflectance for the flat sensor (reference case) can be as high as 40% in the wavelength range of interest. The difference between the reflectance from the flat sensor and from the textured back-surface sensors is readily apparent from the plots in FIG. 5. The nanocone case exhibits the lowest reflectance values. The reflectance of the upright pyramids is also quite low and well below 10%. The reflectance of the inverted pyramids is below 10% for most of the wavelength range. Note that dimensions of the structures and the layers on the structures for which reflectivity is plotted in FIG. 5 are merely intended for illustrative purposes.

One skilled in the art will recognize that the herein described components, operations, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, operations, devices, and objects should not be taken as limiting.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

What is claimed:

1. An image sensor comprising:
   a semiconductor membrane comprising an epitaxial layer, wherein the epitaxial layer includes a first surface and a second textured surface opposite of the first surface, wherein the second textured surface comprises a distribution of nanocones configured to reduce reflection of DUV and VUV light, wherein at least some of the nanocones have heights between 350 nm and 1000 nm and radii of their bases between 80 nm and 160 nm;
   one or more circuit elements formed on the first surface of the epitaxial layer; and
   a boron layer disposed on the distribution of nanocones of the second textured surface of the epitaxial layer, wherein the boron layer conforms to and seals the distribution of nanocones and seals the second textured surface of the epitaxial layer.

2. The image sensor of claim 1, wherein the image sensor is configured to sense at least one of deep ultraviolet (DUV) radiation or vacuum ultraviolet (VUV) radiation.

3. The image sensor of claim 1, wherein the boron layer comprises a boron composition of 75% or greater.

4. The image sensor of claim 1, wherein the distribution of nanocones of the second textured surface comprises a pseudo-random distribution of nanocones.

5. The image sensor of claim 1, wherein the distribution of nanocones of the second textured surface comprises a periodic distribution of nanocones.

6. The image sensor of claim 1, wherein the distribution nanocones of the second textured surface comprises a random distribution of nanocones.

7. The image sensor of claim 1, wherein the boron layer is between 2 nm and 20 nm thick.

8. The image sensor of claim 1, wherein the boron layer comprises less than 10% oxygen near an interface between the boron layer and the epitaxial layer.

9. The image sensor of claim 1, further comprising: an anti-reflection coating disposed on the boron layer.

10. The image sensor of claim 9, wherein the anti-reflection coating comprises at least one of magnesium fluoride, hafnium oxide, strontium tetraborate, silicon dioxide, silicon nitride, titanium dioxide, or aluminum oxide.

11. The image sensor of claim 1, wherein the epitaxial layer is greater than 10 μm in thickness.

12. The image sensor of claim 11, further comprising a doped layer formed in the second textured surface of the epitaxial layer and adjacent to the boron layer.

13. The image sensor of claim 1, further comprising: a support wafer attached to the one or more circuit elements.

14. The image sensor of claim 1, further comprising: a protective layer formed on the one or more circuit elements.

15. The image sensor of claim 1, wherein the image sensor is incorporated within at least one of a one of a charge-coupled device (CCD) and a CMOS device.

16. The image sensor of claim 1, wherein the second textured surface comprises a distribution of at least one of inverted pyramids, and wherein the bases of 80% or more of the at least one of the inverted pyramids have linear dimensions between 150nm and 300nm.

17. The image sensor of claim 1, wherein 80% or more of the nanocones have heights between 350 nm and 1000 nm, and 80% or more of the nanocones have radii of their bases between 80 nm and 160 nm.

\*   \*   \*   \*   \*